(12) United States Patent
Fujimoto et al.

(10) Patent No.: US 8,344,598 B2
(45) Date of Patent: Jan. 1, 2013

(54) PIEZOELECTRIC POWER GENERATION DEVICE

(75) Inventors: Katsumi Fujimoto, Moriyama (JP); Tsuguji Kambayashi, Hikone (JP)

(73) Assignee: Murata Manufacturing Co., Ltd., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 13/413,729

(22) Filed: Mar. 7, 2012

(65) Prior Publication Data

US 2012/0161584 A1  Jun. 28, 2012

Related U.S. Application Data

(62) Division of application No. 12/836,822, filed on Jul. 15, 2010.

(30) Foreign Application Priority Data

Jul. 21, 2009  (JP) .................................. 2009-169914

(51) Int. Cl.
*H01L 41/04* (2006.01)
*H02N 2/02* (2006.01)

(52) U.S. Cl. ......................... 310/339; 310/328; 310/367

(58) Field of Classification Search .......... 310/328–332, 310/338, 339, 367, 369
See application file for complete search history.

(56) References Cited

U.S. PATENT DOCUMENTS

| 4,435,667 A | 3/1984 | Kolm et al. |
| 5,220,327 A | 6/1993 | Abbiate et al. |
| 2002/0118849 A1 * | 8/2002 | Chang et al. .................. 381/190 |

FOREIGN PATENT DOCUMENTS

| JP | 02-087979 A | 3/1990 |
| JP | 3170965 A | 7/1991 |
| JP | 2005-283598 A | 10/2005 |

* cited by examiner

*Primary Examiner* — Derek Rosenau
(74) *Attorney, Agent, or Firm* — Dickstein Shapiro LLP

(57) ABSTRACT

A small-sized piezoelectric power generation device is provided which can generate electric power even with vibrations at low frequencies. The piezoelectric power generation device includes a piezoelectric element formed in a spiral shape and having a center-side end fixed to a first fixing member and an outer-side end fixed to a second fixing member. The piezoelectric element includes a first piezoelectric body formed in a spiral shape and polarized in a radial direction of the piezoelectric element from one side toward the other side. The first and second fixing members are arranged such that the second fixing member is displaceable relative to the first fixing member in a tangential direction x, whereas the second fixing member is restricted from displacing relative to the first fixing member in a perpendicular direction y.

4 Claims, 19 Drawing Sheets

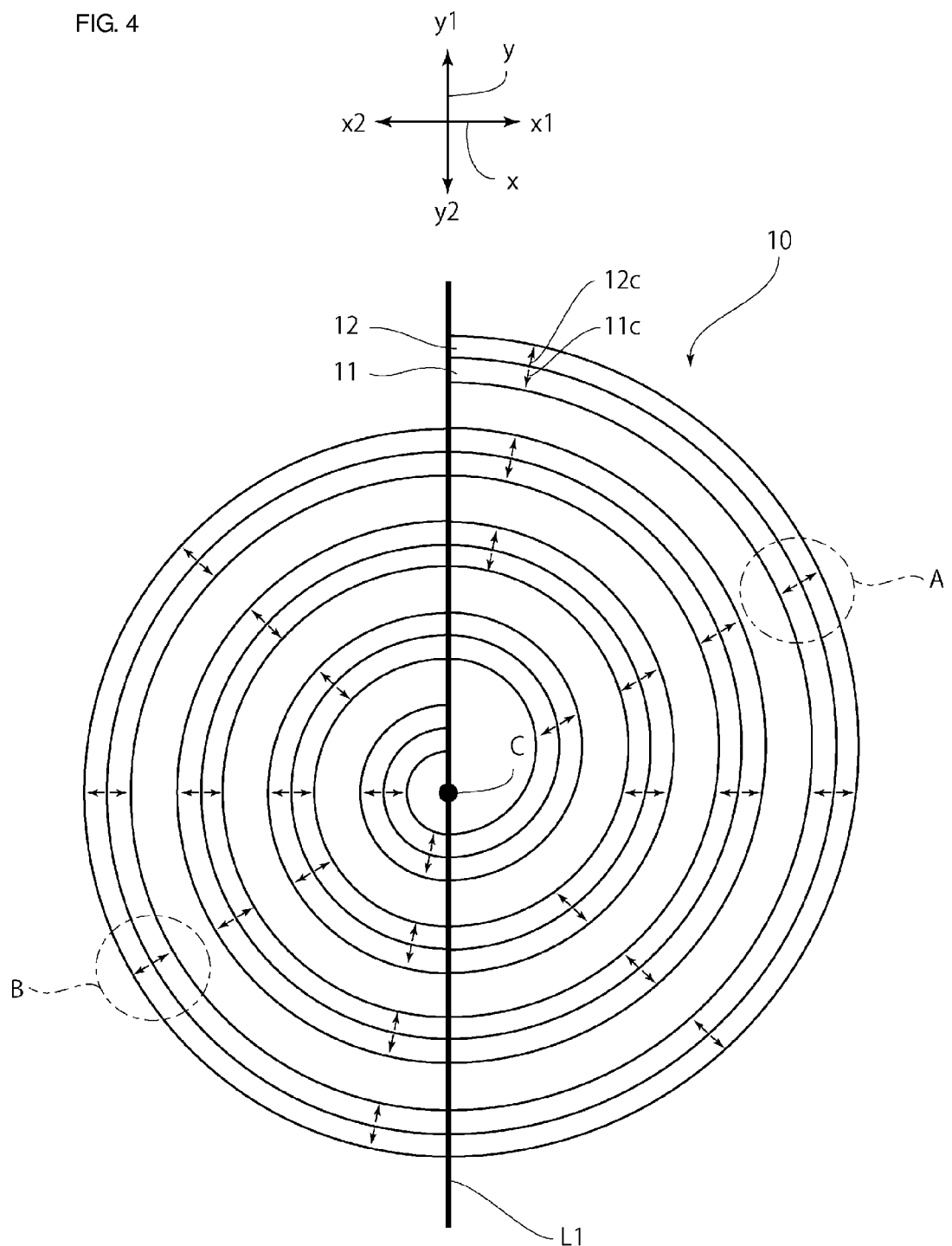

PIEZOELECTRIC POWER GENERATION DEVICE

CROSS REFERENCE TO RELATED APPLICATIONS

The present application is a divisional of application Ser. No. 12/836,822, filed Jul. 15, 2010, the entire contents of which is incorporated herein by reference.

BACKGROUND OF THE INVENTION

1. Field of the Invention

The present invention relates to a piezoelectric power generation device, and more particularly to a piezoelectric power generation device which can generate electric power with vibrations (oscillations) at low frequencies of not higher than about 20 Hz, for example.

2. Description of the Related Art

Hitherto, there is known a piezoelectric power generation device which causes vibrations upon application of accelerations or strains and generates electric power based on the piezoelectric effect. When the piezoelectric power generation device is employed as a power supply, another additional power supply, such as a battery, is no longer required. Accordingly, the above-mentioned piezoelectric power generation device is suitably used as, e.g., a power supply for various sensors which are employed in situations where vibrations or strains are applied.

One example of the above-mentioned piezoelectric power generation device is disclosed in Japanese Patent No. 3170965. FIG. 19 is a perspective view of a piezoelectric power generation device described in Japanese Patent No. 3170965. A piezoelectric power generation device 100 illustrated in FIG. 19 is a unimorph-type piezoelectric power generation device in the form of cantilevered beam. More specifically, as illustrated in FIG. 19, the piezoelectric power generation device 100 includes a piezoelectric element 102. A metal plate 103 is joined to the piezoelectric element 102. Respective one ends of the piezoelectric element 102 and the metal plate 103 are fixed to a case 101. A weight 104 is attached to the other ends of the piezoelectric element 102 and the metal plate 103. Upon acceleration being applied to the piezoelectric power generation device 100, the weight 104 is caused to vibrate. With the vibration of the weight 104, tensile stress and compressive stress are alternately imposed to the piezoelectric element 102. As a result, the piezoelectric element 102 generates electric power.

In the piezoelectric power generation device 100, the resonance frequency of the piezoelectric element 102 is correlated to both the length of the piezoelectric element 102 and the weight of the weight 104. More specifically, as the length from the fixed end to the free end of the piezoelectric element 102 increases, the resonance frequency of the piezoelectric element 102 lowers. Also, as the weight of the weight 104 increases, the resonance frequency of the piezoelectric element 102 lowers.

In order to generate electric power with vibrations at low frequencies, therefore, it is required to lower the resonance frequency of the piezoelectric element 102 by increasing the length of the piezoelectric element 102 and the weight of the weight 104. Thus, trying to generate electric power with vibrations at low frequencies causes a problem that the size of the piezoelectric power generation device 100 necessarily increases. In particular, the frequency of a motion of a human body, e.g., walking, is usually as very low as about 20 Hz or less. Accordingly, when the low-frequency vibration provided by the motion of the human body is utilized to generate electric power, a problem arises in that the piezoelectric power generation device 100 is required to have a very large size.

SUMMARY OF THE INVENTION

In view of the above-described problems, an object of the present invention is to provide a piezoelectric power generation device which has a small size and which can generate electric power even with vibrations at frequencies as low as about 20 Hz or less, for example.

A piezoelectric power generation device according to a first preferred embodiment of the present invention includes a piezoelectric element, a first fixing member, and a second fixing member. The piezoelectric element is formed substantially in a spiral shape. A center-side end of the piezoelectric element is fixed to the first fixing member. An outer-side end of the piezoelectric element is fixed to the second fixing member. The piezoelectric element includes a first piezoelectric body, a first electrode, a second electrode, and an elastic member. The first piezoelectric body is formed substantially in a spiral shape. The first piezoelectric body is polarized in a radial direction from one side toward the other side. The first electrode is disposed on an inner surface of the first piezoelectric body as viewed in the radial direction. The second electrode is disposed on an outer surface of the first piezoelectric body as viewed in the radial direction. The elastic member is disposed on an outer surface of the second electrode as viewed in the radial direction or an inner surface of the first electrode as viewed in the radial direction. The first and second fixing members are constituted such that the second fixing member is displaceable relative to the first fixing member in a direction tangential to the outer-side end of the piezoelectric element, whereas the second fixing member is restricted from displacing relative to the first fixing member in a direction that is perpendicular to the direction tangential to the outer-side end of the piezoelectric element.

In one particular aspect of the piezoelectric power generation device according to the first preferred embodiment of the present invention, the elastic member is a second piezoelectric body which is polarized in the radial direction from the other side toward the one side, and the piezoelectric element further includes a third electrode disposed on a surface of the second piezoelectric body. With such an arrangement, a higher level of power generation efficiency can be obtained.

In another particular aspect of the piezoelectric power generation device according to the first preferred embodiment of the present invention, the first fixing member includes a plate-like member having one surface on which the piezoelectric element is positioned, and a projected portion projecting from the one surface of the plate-like member at a position outwards of the outer-side end of the piezoelectric element as viewed in the radial direction, the second fixing member is positioned on the side closer to the piezoelectric element with respect to the projected portion and has a contact surface extending in the direction tangential to the outer-side end of the piezoelectric element, and the contact surface is held in contact with the projected portion. With such an arrangement, the second fixing member can be effectively restricted from displacing relative to the first fixing member in the radial direction of the piezoelectric element, and the displacement of the second fixing member relative to the first fixing member in the direction tangential to the outer-side end of the piezoelectric element can be increased. Hence, a higher level of power generation efficiency can be realized.

In still another particular aspect of the piezoelectric power generation device according to the first preferred embodiment of the present invention, the second fixing member includes a fixing member body having the contact surface, a first stopper portion connected to the fixing member body and positioned on one side with respect to the projected portion as viewed in the direction tangential to the outer-side end of the piezoelectric element, and a second stopper portion connected to the fixing member body and positioned on the other side with respect to the projected portion as viewed in the direction tangential to the outer-side end of the piezoelectric element. With such an arrangement, the second fixing member can be restricted from excessively displacing relative to the first fixing member in the tangential direction. Hence, the piezoelectric element can be effectively protected against damage that may be otherwise caused by large stress imposed to the piezoelectric element.

A piezoelectric power generation device according to a second preferred embodiment of the present invention includes first and second piezoelectric elements, a plate-like first fixing member, and a second fixing member. The first and second piezoelectric elements are each formed substantially in a spiral shape. The first piezoelectric element and the second piezoelectric element are arranged on one surface of the first fixing member. A center-side end of the first piezoelectric element and a center-side end of the second piezoelectric element are both fixed to the first fixing member. The second fixing member is positioned on the one surface of the first fixing member between the first piezoelectric element and the second piezoelectric element. A portion of the first piezoelectric element positioned closest to the second piezoelectric element and a portion of the second piezoelectric element positioned closest to the first piezoelectric element are both fixed to the second fixing member on a straight line passing a center of the first piezoelectric element and a center of the second piezoelectric element. The second fixing member is displaceable relative to the first fixing member. Each of the first and second piezoelectric elements includes a first piezoelectric body, a first electrode, a second electrode, and an elastic member. The first piezoelectric body is formed substantially in a spiral shape. The first piezoelectric body is polarized in a radial direction from one side toward the other side. The first electrode is disposed on an inner surface of the first piezoelectric body as viewed in the radial direction. The second electrode is disposed on an outer surface of the first piezoelectric body as viewed in the radial direction. An elastic member is disposed on an outer surface of the second electrode as viewed in the radial direction or an inner surface of the first electrode as viewed in the radial direction.

In one particular aspect of the piezoelectric power generation device according to the second preferred embodiment of the present invention, the elastic member is a second piezoelectric body which is polarized in the radial direction from the other side toward the one side, and each of the first and second piezoelectric elements further includes a third electrode disposed on a surface of the second piezoelectric body. With such an arrangement, a higher level of power generation efficiency can be obtained.

In another particular aspect of the piezoelectric power generation device according to the second preferred embodiment of the present invention, an outer-side end of the first piezoelectric element and an outer-side end of the second piezoelectric element are positioned on a portion of the straight line passing the center of the first piezoelectric element and the center of the second piezoelectric element, which portion is located between the center of the first piezoelectric element and the center of the second piezoelectric element, and the outer-side end of the first piezoelectric element and the outer-side end of the second piezoelectric element are fixed to the second fixing member. With such an arrangement, stresses are imposed to the entirety of the first and second piezoelectric bodies upon the second fixing member displacing relative to the first fixing member, whereby the first and second piezoelectric bodies are entirely deformed. Hence, the power generation efficiency can be further increased.

A piezoelectric power generation device according to a third preferred embodiment of the present invention includes a piezoelectric element, a first fixing member, and a second fixing member. The piezoelectric element is formed substantially in a spiral shape. A center-side end of the piezoelectric element is fixed to the first fixing member. An outer-side end of the piezoelectric element is fixed to the second fixing member. The piezoelectric element includes a first piezoelectric body, a first electrode, a second electrode, and an elastic member. The first piezoelectric body is formed is formed substantially in a spiral shape. The first electrode is disposed on an inner surface of the first piezoelectric body as viewed in the radial direction. The second electrode is disposed on an outer surface of the first piezoelectric body as viewed in the radial direction. An elastic member is disposed on an outer surface of the second electrode as viewed in the radial direction or an inner surface of the first electrode as viewed in the radial direction. A portion of the first piezoelectric body, which is located on one side of a straight line passing a center of the piezoelectric element and the outer-side end of the piezoelectric element, is polarized in the radial direction of the piezoelectric element from one side toward the other side, and a portion of the first piezoelectric body, which is located on the other side of the straight line passing the center of the piezoelectric element and the outer-side end of the piezoelectric element, is polarized in the radial direction of the piezoelectric element from the other side toward the one side. The first and second fixing members are constituted such that the second fixing member is displaceable relative to the first fixing member in a direction in which the straight line passing the center of the piezoelectric element and the outer-side end of the piezoelectric element extends, whereas the second fixing member is restricted from displacing relative to the first fixing member in a direction tangential to the outer-side end of the piezoelectric element.

In one particular aspect of the piezoelectric power generation device according to the third preferred embodiment of the present invention, the elastic member is a second piezoelectric body. A portion of the second piezoelectric body, which is located on one side of the straight line passing the center of the piezoelectric element and the outer-side end of the piezoelectric element, is polarized in the radial direction of the piezoelectric element from the other side toward the one side. A portion of the second piezoelectric body, which is located on the other side of the straight line passing the center of the piezoelectric element and the outer-side end of the piezoelectric element, is polarized in the radial direction of the piezoelectric element from the one side toward the other side. The piezoelectric element further includes a third electrode disposed on a surface of the second piezoelectric body.

In still another particular aspect of the piezoelectric power generation device according to the third preferred embodiment of the present invention, the first fixing member includes a plate-like member having one surface on which the piezoelectric element is positioned, and a projected portion projecting from the one surface of the plate-like member at a position outwards of the outer-side end of the piezoelectric element as viewed in the radial direction, the second fixing member includes a first guide portion extending in the direction in which the straight line passing the center of the piezoelectric element and the outer-side end of the piezoelectric element extends, and positioned on one side with respect to the projected portion as viewed in the direction tangential to the outer-side end of the piezoelectric element, and a second guide portion extending in the direction in which the straight line passing the center of the piezoelectric element and the outer-side end of the piezoelectric element extends, and positioned on the other side with respect to the projected portion as viewed in the direction tangential to the outer-side end of the piezoelectric element, and the first and second guide portions are each held in contact with the projected portion. With such an arrangement, the second fixing member can be effectively restricted from displacing relative to the first fixing member in the direction tangential to the outer-side end of the piezoelectric element, and the displacement of the second fixing member relative to the first fixing member in the radial direction of the piezoelectric element can be increased. Hence, a higher level of power generation efficiency can be realized.

A piezoelectric power generation device according to a fourth preferred embodiment of the present invention includes first and second piezoelectric elements, a plate-like first fixing member, and a second fixing member. The first and second piezoelectric elements are each formed substantially in a spiral shape. The first piezoelectric element and the second piezoelectric element are arranged on one surface of the first fixing member so as to line up in one direction. A center-side end of the first piezoelectric element and a center-side end of the second piezoelectric element are both fixed to the first fixing member. A second fixing member is arranged on the one surface of the first fixing member to be displaceable relative to the first fixing member. The second fixing member includes a connecting portion and a weight portion. The connecting portion interconnects a portion of the first piezoelectric element, which is positioned closest to one side in a second direction perpendicular to the first direction, and a portion of the second piezoelectric element, which is positioned closest to the one side in the second direction. The weight portion extends from the connecting portion in the second direction and is positioned between a center of the first piezoelectric element and a center of the second piezoelectric element as viewed in the first direction. Each of the first and second piezoelectric elements includes a first piezoelectric body, a first electrode, a second electrode, and an elastic member. The first piezoelectric body is formed substantially in a spiral shape. The first electrode is disposed on an inner surface of the first piezoelectric body as viewed in the radial direction. The second electrode is disposed on an outer surface of the first piezoelectric body as viewed in the radial direction. The elastic member is disposed on an outer surface of the second electrode as viewed in the radial direction or an inner surface of the first electrode as viewed in the radial direction.

Further, a portion of the first piezoelectric body of the first piezoelectric element, which is located on one side of a straight line passing a center of the first piezoelectric element and an outer-side end of the first piezoelectric element, is polarized in the radial direction of the first piezoelectric element from one side toward the other side. A portion of the first piezoelectric body of the first piezoelectric element, which is located on the other side of the straight line passing the center of the first piezoelectric element and the outer-side end of the first piezoelectric element, is polarized in the radial direction of the first piezoelectric element from the other side toward the one side.

Still further, a portion of the first piezoelectric body of the second piezoelectric element, which is located on one side of a straight line passing a center of the second piezoelectric element and an outer-side end of the second piezoelectric element, is polarized in the radial direction of the second piezoelectric element from one side toward the other side. A portion of the first piezoelectric body of the second piezoelectric element, which is located on the other side of the straight line passing the center of the second piezoelectric element and the outer-side end of the second piezoelectric element, is polarized in the radial direction of the second piezoelectric element from the other side toward the one side.

In one particular aspect of the piezoelectric power generation device according to the fourth preferred embodiment of the present invention, the elastic member is a second piezoelectric body, a portion of the second piezoelectric body of the first piezoelectric element, which is located on one side of the straight line passing the center of the first piezoelectric element and the outer-side end of the first piezoelectric element, is polarized in the radial direction of the first piezoelectric element from the other side toward the one side, and a portion of the second piezoelectric body of the first piezoelectric element, which is located on the other side of the straight line passing the center of the first piezoelectric element and the outer-side end of the first piezoelectric element, is polarized in the radial direction of the first piezoelectric element from the one side toward the other side. A portion of the second piezoelectric body of the second piezoelectric element, which is located on one side of the straight line passing the center of the second piezoelectric element and the outer-side end of the second piezoelectric element, is polarized in the radial direction of the second piezoelectric element from the other side toward the one side. A portion of the second piezoelectric body of the second piezoelectric element, which is located on the other side of the straight line passing the center of the second piezoelectric element and the outer-side end of the second piezoelectric element, is polarized in the radial direction of the second piezoelectric element from the one side toward the other side. Each of the first and second piezoelectric elements further includes a third electrode disposed on a surface of the second piezoelectric body. With such an arrangement, a higher level of power generation efficiency can be obtained.

In another particular aspect of the piezoelectric power generation device according to the fourth preferred embodiment of the present invention, the outer-side end of the first piezoelectric element is positioned on a portion of a straight line passing the center of the first piezoelectric element and extending in the second direction, which portion is located on one side with respect to the center of the first piezoelectric element as viewed in the second direction, the outer-side end of the second piezoelectric element is positioned on a portion of a straight line passing the center of the second piezoelectric element and extending in the second direction, which portion is located on one side with respect to the center of the second piezoelectric element as viewed in the second direction, and the connecting portion interconnects the outer-side end of the first piezoelectric element and the outer-side end of the second piezoelectric element. With such an arrangement, stresses are imposed to the entirety of the first and second piezoelectric bodies upon the second fixing member displacing relative to the first fixing member, whereby the first and second piezoelectric bodies are entirely deformed. Hence, the power generation efficiency can be further increased.

With the piezoelectric power generation devices according to the first to fourth preferred embodiments of the present invention, since the piezoelectric body is formed substantially in the spiral shape, the distance between both the fixed ends of the piezoelectric body can be increased without enlarging the size of the piezoelectric power generation device. In other words, the piezoelectric element having a longer size can be compactly stored in a smaller space by forming the piezoelectric element substantially in the spiral shape. As a result, the piezoelectric power generation device capable of being driven with vibrations at low frequencies can be realized while the device size is held small.

Also, with the piezoelectric power generation devices according to the first and second preferred embodiments of the present invention, the first piezoelectric body is polarized in the radial direction of the piezoelectric element from the one side toward the other side, and the second fixing member to which the outer-side end of the piezoelectric element is fixed is displaced just in the direction tangential to the outer-side end of the piezoelectric element relative to the first fixing member to which the center-side end of the piezoelectric element is fixed. Therefore, electric power can be generated at a high level of power generation efficiency.

Further, with the piezoelectric power generation devices according to the third and fourth preferred embodiments of the present invention, the portion of the first piezoelectric body, which is located on the one side of the straight line passing the center of the piezoelectric element and the outer-side end of the piezoelectric element, is polarized in the radial direction of the piezoelectric element from the one side toward the other side, and the portion of the first piezoelectric body, which is located on the other side of the straight line passing the center of the piezoelectric element and the outer-side end of the piezoelectric element, is polarized in the radial direction of the piezoelectric element from the other side toward the one side. In addition, the second fixing member to which the outer-side end of the piezoelectric element is fixed is displaced just in the radial direction of the piezoelectric element relative to the first fixing member to which the center-side end of the piezoelectric element is fixed. Therefore, electric power can be generated at a high level of power generation efficiency.

Other features, elements, characteristics and advantages of the present invention will become more apparent from the following detailed description of preferred embodiments of the present invention with reference to the attached drawings.

BRIEF DESCRIPTION OF THE DRAWINGS

FIG. 4 is a schematic plan view to explain the direction of polarization in the piezoelectric element in the first embodiment (first to third electrodes are omitted in FIG. 4 for convenience in drawing the figure);

FIG. 5A is a schematic explanatory view illustrating the direction of polarization in a portion A which is located on the right side of a straight line L1 in FIG. 4 and stresses imposed to the right-side portion A, and FIG. 5B is a schematic explanatory view illustrating the direction of polarization in a portion B which is located on the left side of the straight line L1 in FIG. 4 and stresses imposed to the left-side portion B;

FIG. 6A is a schematic explanatory view illustrating the direction of polarization in the portion A which is located on the right side of the straight line L1 in FIG. 4 and stresses imposed to the right-side portion A, and FIG. 6B is a schematic explanatory view illustrating the direction of polarization in the portion B which is located on the left side of the straight line L1 in FIG. 4 and stresses imposed to the left-side portion B;

FIG. 14A is a schematic explanatory view illustrating the direction of polarization in a portion A which is located on the right side of a straight line L1 in FIG. 13 and stresses imposed to the right-side portion A, and FIG. 14B is a schematic explanatory view illustrating the direction of polarization in a portion B which is located on the left side of the straight line L1 in FIG. 13 and stresses imposed to the left-side portion B;

FIG. 15A is a schematic explanatory view illustrating the direction of polarization in the portion A which is located on the right side of the straight line L1 in FIG. 13 and stresses imposed to the right-side portion A, and FIG. 15B is a schematic explanatory view illustrating the direction of polarization in the portion B which is located on the left side of the straight line L1 in FIG. 13 and stresses imposed to the left-side portion B;

DESCRIPTION OF THE PREFERRED EMBODIMENTS

The present invention will be apparent upon reading the following descriptions of preferred embodiments of the present invention with reference to the drawings.

First Embodiment

Figure 1:
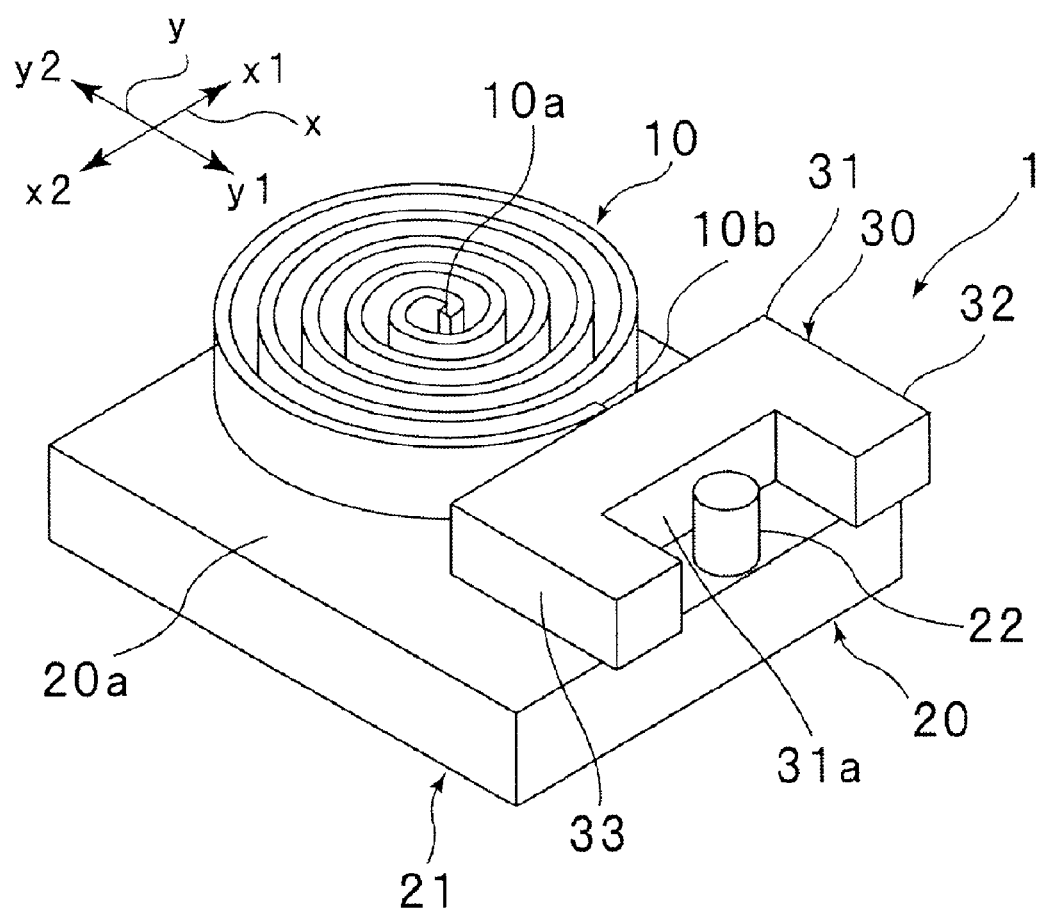
FIG. 1 is a schematic perspective view of a piezoelectric power generation device according to a first embodiment.

FIG. 1 is a schematic perspective view of a piezoelectric power generation device 1 according to a first embodiment. As illustrated in FIG. 1, the piezoelectric power generation device 1 includes a piezoelectric element 10 and first and second fixing members 20 and 30. The piezoelectric power generation device 1 generates electric power by utilizing vibration of the piezoelectric element 10 in the d31 mode.

The piezoelectric element 10 is formed substantially in a spiral (coiled) shape. More specifically, the piezoelectric element 10 helically extends from a center of the spiral in a tangential direction perpendicular to a radial direction while gradually increasing the diameter of the spiral. A width W (see FIG. 3) of the piezoelectric element 10 is smaller than a height H (see FIG. 3) of the piezoelectric element 10.

Figure 2:
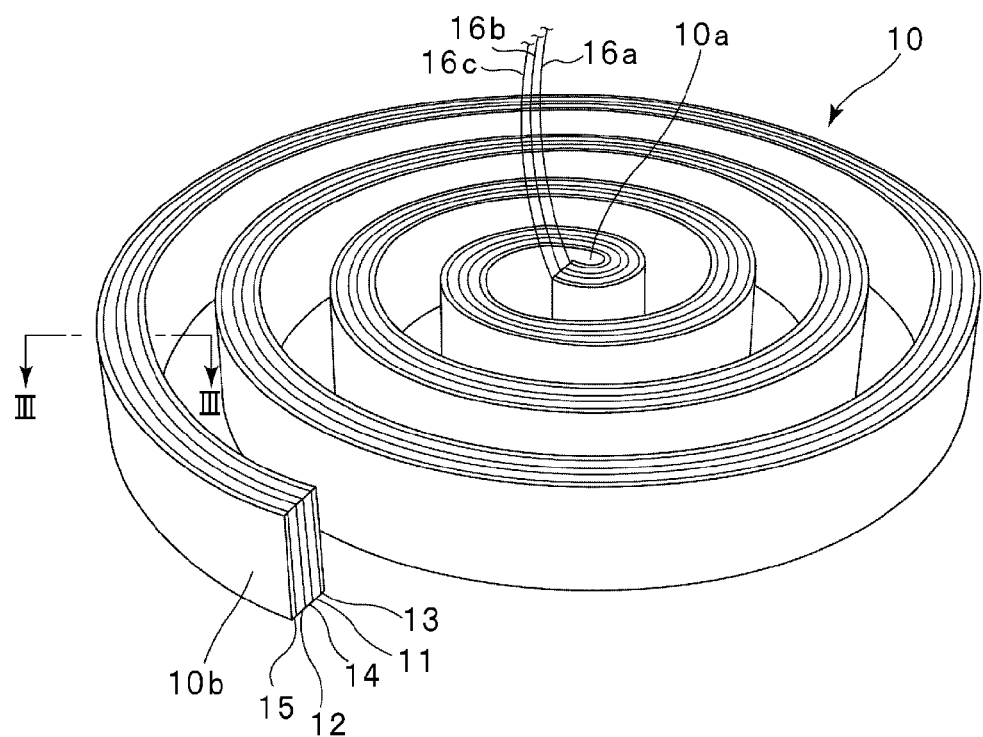
FIG. 2 is a schematic perspective view of a piezoelectric element in the first embodiment.
Figure 3:
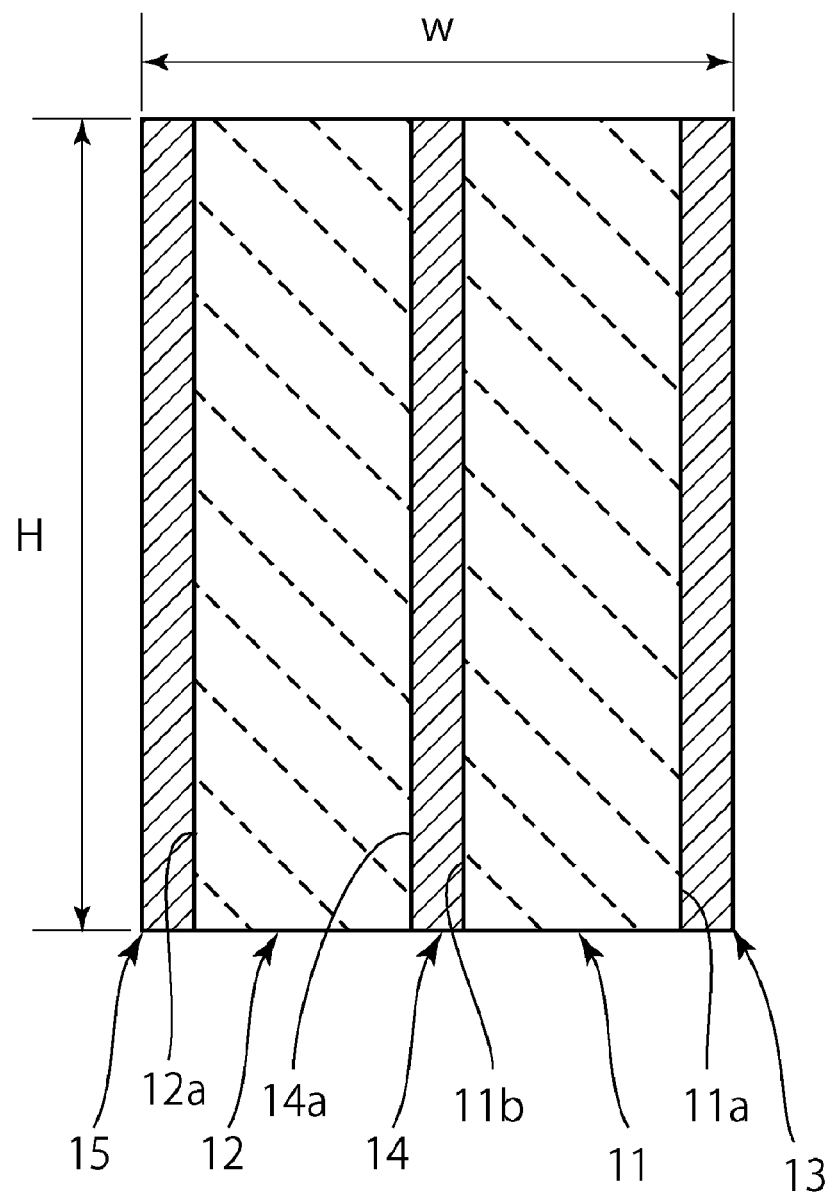
FIG. 3 is a schematic sectional view of a portion cut out along a cut line III-III in FIG. 2.

As illustrated in FIGS. 2 and 3, the piezoelectric element 10 includes first and second piezoelectric bodies 11 and 12, and first to third electrodes 13, 14 and 15. The first piezoelectric body 11 is formed substantially in the spiral shape. As illustrated in FIG. 3, a first electrode 13 is formed on an inner surface 11a of the first piezoelectric body 11 as viewed in the radial direction. On the other hand, a second electrode 14 is formed on an outer surface 11b of the first piezoelectric body 11 as viewed in the radial direction. A second piezoelectric body 12 is disposed on an outer surface 14a of the second electrode 14 as viewed in the radial direction. A third electrode 15 is formed on an outer surface 12a of the second piezoelectric body 12 as viewed in the radial direction. Stated another way, the first electrode 13, the first piezoelectric body 11, the second electrode 14, the second piezoelectric body 12, and the third electrode 15 are successively formed in the named order in the radial direction of the piezoelectric element 10 from the inner side toward the outer side thereof. Thus, the first piezoelectric body 11 is sandwiched between the first electrode 13 and the second electrode 14. Electric power generated in the first piezoelectric body 11 is taken out through a lead wire 16a (see FIG. 2) connected to the first electrode 13 and a lead wire 16b (see FIG. 2) connected to the second electrode 14. On the other hand, the second piezoelectric body 12 is sandwiched between the second electrode 14 and the third electrode 15. Electric power generated in the second piezoelectric body 12 is taken out through the lead wire 16b (see FIG. 2) connected to the second electrode 14 and a lead wire 16c (see FIG. 2) connected to the third electrode 15.

The first to third electrodes 13 to 15 are each formed of a suitable conductive material. The first to third electrodes 13 to 15 can be each formed of, for example, one of metals, such as Al, Ag, Cu, Pt, Au, Cr and Ni, or an alloy containing one or more of those metals.

The first and second piezoelectric bodies 11 and 12 are each formed of a suitable piezoelectric material. The first and second piezoelectric bodies 11 and 12 can be each formed of, for example, a piezoelectric ceramic such as a lead zirconate titanate-based ceramic, a piezoelectric resin such as PVDF (PolyVinylidene DiFluoride), or a composite material made up of at least one of the piezoelectric ceramic and the piezoelectric resin, and a resin having no piezoelectricity (i.e., non-piezoelectric resin). Examples of the non-piezoelectric resin usable in the above-mentioned composite material include a silicone resin, a PPS (Polyphenylene Sulfide) resin, a PBT (Polybutylene Terephtalate) resin, a PTFE (Polytetrafluoroethylene) resin, a PET (Polyethylene Terephthalate) resin, and a PE (Polyethylene) resin. When the piezoelectric resin or the composite material is used, the piezoelectric bodies 11 and 12 each having substantially the spiral shape can be more easily formed than the case of using only the piezoelectric ceramic for the reason that a high-temperature firing step can be dispensed with in the former case. Further, when the composite material is used, an output of piezoelectricity produced in a local area of the piezoelectric power generation device, i.e., of the piezoelectric body, can be adjusted by controlling a percentage of the piezoelectric ceramic or the piezoelectric resin that is contained in the composite material.

FIG. 4 is a schematic plan view to explain the direction of polarization in each of the first and second piezoelectric bodies 11 and 12. Be it noted that, in FIG. 4, the direction of polarization in each of the first and second piezoelectric bodies 11 and 12 is indicated by an arrow.

As illustrated in FIG. 4, the direction 11c of polarization in the first piezoelectric body 11 and the direction 12c of polarization in the second piezoelectric body 12 are both oriented in the radial direction of the piezoelectric element 10 and are opposed to each other.

More specifically, the direction 11c of polarization in the first piezoelectric body 11 is oriented in the radial direction of the piezoelectric element 10 from one side toward the other side. Thus, the first piezoelectric body 11 is polarized in the radial direction of the piezoelectric element 10 from the one side toward the other side. As one practical example, in the first embodiment, the direction 11c of polarization in the first piezoelectric body 11 is oriented inwards in the radial direction of the piezoelectric element 10.

On the other hand, the direction 12c of polarization in the second piezoelectric body 12 is oriented in the radial direction of the piezoelectric element 10 from the other side toward the one side. Thus, the second piezoelectric body 12 is polarized in the radial direction of the piezoelectric element 10 from the other side toward the one side. As one practical example, in the first embodiment, the direction 12c of polarization in the second piezoelectric body 12 is oriented outwards in the radial direction of the piezoelectric element 10.

As illustrated in FIG. 1, the piezoelectric element 10 is disposed on a surface 20a of a plate-like first fixing member 20. A center-side end 10a of the piezoelectric element 10 is fixed to the first fixing member 20. Meanwhile, an outer-side end 10b of the piezoelectric element 10 is not fixed to the first fixing member 20, but it is fixed to a second fixing member 30.

A method of fixing the piezoelectric element 10 to the first and second fixing members 20 and 30 is not limited to a particular one. The piezoelectric element 10 may be fixed to the first and second fixing members 20 and 30, for example, by welding or by using an adhesive, bolts, etc.

The second fixing member 30 is displaceable relative to the first fixing member 20 in a direction x tangential to the outer-side end 10b of the piezoelectric element 10. On the other hand, the second fixing member 30 is restricted from displacing relative to the first fixing member 20 in a direction y perpendicular to the tangential direction x.

More specifically, the first fixing member 20 includes a plate-like member 21 and a projected portion 22. The center-side end 10a of the piezoelectric element 10 is fixed to one surface of the plate-like member 21. The projected portion 22 is formed on the one surface of the plate-like member 21. The projected portion 22 is projected from the one surface of the plate-like member 21 in a direction normal to that one surface at a position outwards of the outer-side end 10b of the piezoelectric element 10 as viewed in the radial direction.

While the projected portion 22 is substantially columnar (cylindrical) in the first embodiment, the shape of the projected portion 22 is not limited to a column. The projected portion 22 may have substantially the shape of a triangular prism, a polygonal column, a cone, or a truncated cone, for example. Further, the projected portion 22 and the plate-like member 21 may be integral with each other or separate from each other.

The second fixing member 30 is disposed on the first fixing member 20. The second fixing member 30 is displaceable relative to the first fixing member 20 in the planar direction of the plate-like member 21 of the first fixing member 20. The second fixing member 30 may be displaceable or not displaceable relative to the first fixing member 20 in a direction normal to the plate-like member 21.

The second fixing member 30 includes a fixing member body 31 and first and second stopper portions 32 and 33 which are connected to the fixing member body 31. The outer-side end 10b of the piezoelectric element 10 is connected to the fixing member body 31. The fixing member body 31 is positioned between the outer-side end 10b of the piezoelectric element 10 and the projected portion 22. In the first embodiment, the fixing member body 31 is formed substantially in a parallelepiped shape, and an end surface of the fixing member body 31 on the side facing the projected portion 22 defines a contact surface 31a that is held in contact with the projected portion 22. The contact surface 31a extends in the tangential direction x.

The first stopper portion 32 is positioned on one side, denoted by x1, with respect to the projected portion 22 as viewed in the tangential direction x. The first stopper portion 32 extends in the direction y from the contact surface 31a toward one side, denoted by y1, in the direction y. On the other hand, the second stopper portion 33 is positioned on the other side, denoted by x2, with respect to the projected portion 22 as viewed in the tangential direction x. The second stopper portion 33 also extends in the direction y from the contact surface 31a toward the side y1 in the direction y.

In the first embodiment, therefore, the second fixing member 30 and the outer-side end 10b of the piezoelectric element 10, which is fixed to the second fixing member 30, are replaceable in the tangential direction x through a distance between the first stopper portion 32 and the second stopper portion 33, as viewed in the tangential direction x, relative to the first fixing member 20 and the center-side end 10a of the piezoelectric element 10, which is fixed to the first fixing member 20, but they are not displaceable in the direction y.

While the first embodiment is described, by way of example, in connection with the case where the end surface of the fixing member body 31 on the side facing the projected portion 22 is held in contact with the projected portion 22, a clearance may be left between the end surface of the fixing member body 31 on the side facing the projected portion 22 and the projected portion 22. When a clearance is left between the end surface of the fixing member body 31 on the side facing the projected portion 22 and the projected portion 22, the second fixing member 30 is apt to displace in the perpendicular direction y relative to the first fixing member 20. In such a case, therefore, the size of the clearance between the end surface of the fixing member body 31 on the side facing the projected portion 22 and the projected portion 22 is preferably set to be about 0.2 mm or less.

In the piezoelectric power generation device 1 according to the first embodiment, when vibration is applied to the piezoelectric power generation device 1, stresses are imposed to the first and second piezoelectric bodies 11 and 12, thus causing the first and second piezoelectric bodies 11 and 12 to deform. As a result, electric power is generated in the first and second piezoelectric bodies 11 and 12 and is taken out through the first to third electrodes 13 to 15.

Linear reciprocating vibrations applied to the piezoelectric power generation device 1 include vibration reciprocating in the tangential direction x illustrated in FIG. 4, vibration reciprocating in the perpendicular direction y that is perpendicular to the tangential direction x, and vibration reciprocating in a direction inclined to both the tangential direction x and the perpendicular direction y. The vibration reciprocating in the direction inclined to both the tangential direction x and the perpendicular direction y can be regarded as a resultant vibration of the vibration in the tangential direction x and the vibration in the perpendicular direction y. Therefore, the linear reciprocating vibrations applied to the piezoelectric power generation device 1 can be essentially divided into two main vibrations, i.e., the vibration in the tangential direction x and the vibration in the perpendicular direction y.

Figure 5A:
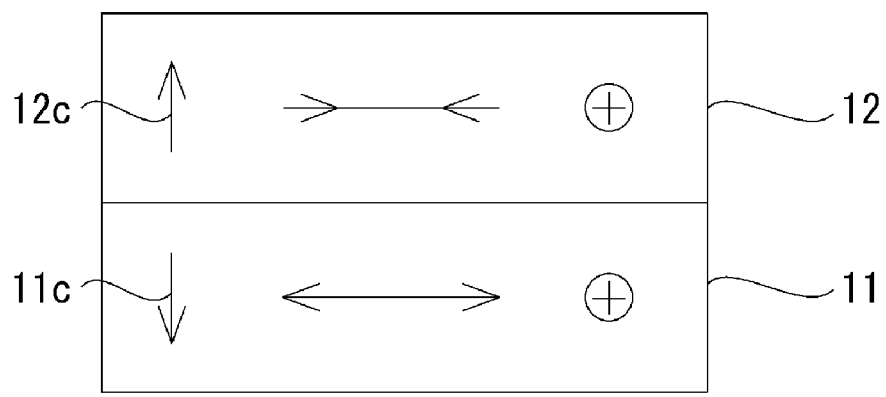
FIGS. 5A and 5B are each a schematic explanatory view of the piezoelectric element when reciprocating vibration in the perpendicular direction y is applied to the piezoelectric element in the first embodiment; specifically
Figure 5B:
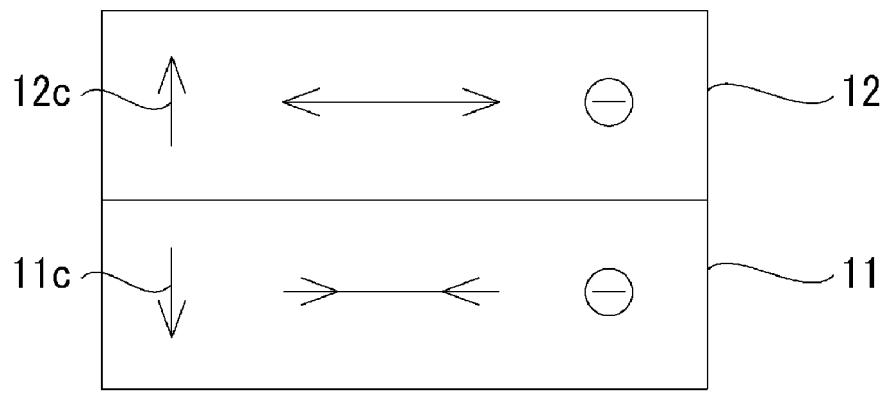
Figure 6A:
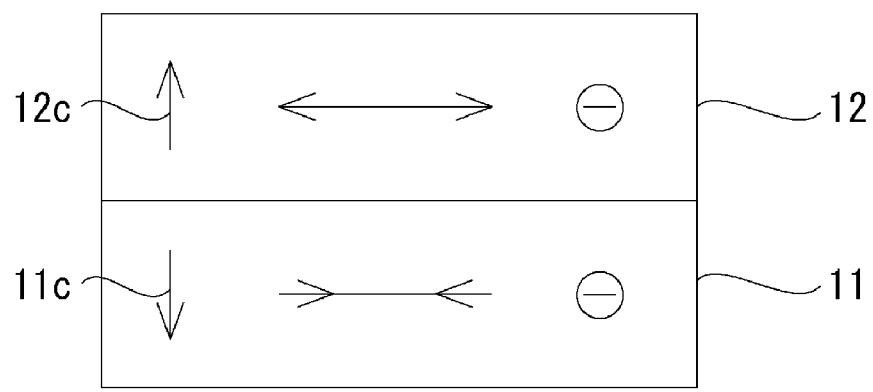
FIGS. 6A and 6B are each a schematic explanatory view of the piezoelectric element when reciprocating vibration in the tangential direction x is applied to the piezoelectric element in the first embodiment; specifically
Figure 6B:
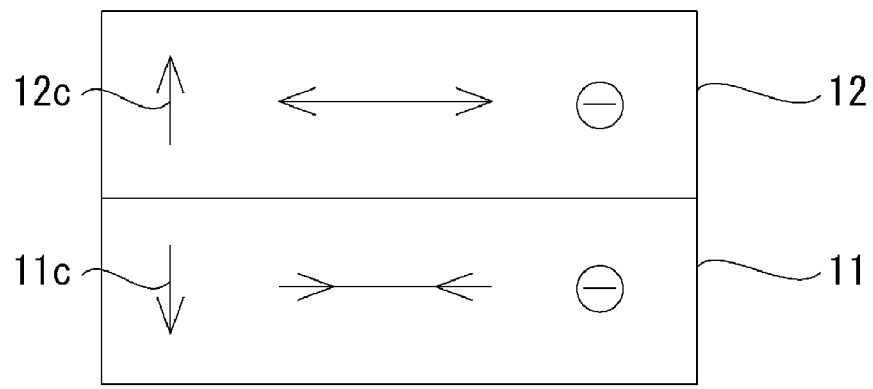

For example, when the reciprocating vibration in the perpendicular direction y is applied to the piezoelectric element 10, different stresses are imposed to the first and second piezoelectric bodies 11 and 12 between the right side and the left side of a straight line L1 passing a center C of the piezoelectric element 10 and the outer-side end 10b of the piezoelectric element 10. FIGS. 5A and 5B illustrate the stresses imposed to a portion A which is located on the right side of the straight line L1 in FIG. 4 and the stresses imposed to a portion B which is located on the left side of the straight line L1 in FIG. 4, respectively, when the outer-side end 10b of the piezoelectric element 10 is displaced toward the side y1 in the perpendicular direction y. Also, FIGS. 6A and 6B illustrate the stresses imposed to the portion A which is located on the right side of the straight line L1 in FIG. 4 and the stresses imposed to the portion B which is located on the left side of the straight line L1 in FIG. 4, respectively, when the outer-side end 10b of the piezoelectric element 10 is displaced toward the side x2 in the tangential direction x.

First, the case where the reciprocating vibration in the perpendicular direction y is applied to the piezoelectric element 10 will be described below by primarily referring to FIG. 4 and FIGS. 5A and 5B. FIG. 5A is a schematic explanatory view illustrating the direction of polarization in the portion A which is located on the right side of the straight line L1 in FIG. 4 and the stresses imposed to the right-side portion A. FIG. 5B is a schematic explanatory view illustrating the direction of polarization in the portion B which is located on the left side of the straight line L1 in FIG. 4 and the stresses imposed to the left-side portion B.

When the outer-side end 10b of the piezoelectric element 10 is displaced toward the side y1 in the perpendicular direction y, the right-side portion A is deformed in a direction in which the curvature increases. As illustrated in FIG. 5A, therefore, tensile stress is imposed to the first piezoelectric body 11 and compressive stress is imposed to the second piezoelectric body 12.

Also, when the outer-side end 10b of the piezoelectric element 10 is displaced toward the side y1 in the perpendicular direction y, the left-side portion B is deformed in a direction in which the curvature decreases. As illustrated in FIG. 5B, therefore, compressive stress is imposed to the first piezoelectric body 11 and tensile stress is imposed to the second piezoelectric body 12.

Thus, when the reciprocating vibration in the perpendicular direction y is applied to the piezoelectric element 10, the directions of the stresses imposed to the first piezoelectric body 11 are opposed between the right side and the left side of the straight line L1. In the first embodiment, the first piezoelectric body 11 is polarized in the radial direction of the piezoelectric element 10 from the outer side toward the inner side thereof in both the right side and the left side of the straight line L1. Accordingly, voltages having different polarities are generated in the right-side portion A and the left-side portion B of the first piezoelectric body 11. As illustrated in FIGS. 5A and 5B, for example, when a plus voltage is generated in the right-side portion A of the first piezoelectric body 11, a minus voltage is generated in the left-side portion B of the first piezoelectric body 11. As a result, the voltage generated in the right-side portion A of the first piezoelectric body 11 and the voltage generated in the left-side portion B of the first piezoelectric body 11 cancel each other out. Hence, power generation efficiency in the first piezoelectric body 11 reduces.

Similarly, when the reciprocating vibration in the perpendicular direction y is applied to the piezoelectric element 10, the directions of the stresses imposed to the second piezoelectric body 12 are opposed between the right side and the left side of the straight line L1. In the first embodiment, the second piezoelectric body 12 is polarized in the radial direction of the piezoelectric element 10 from the inner side toward the outer side thereof in both the right side and the left side of the straight line L1. Accordingly, voltages having different polarities are generated in the right-side portion A and the left-side portion B of the second piezoelectric body 12. As illustrated in FIGS. 5A and 5B, for example, when a plus voltage is generated in the right-side portion A of the second piezoelectric body 12, a minus voltage is generated in the left-side portion B of the second piezoelectric body 12. As a result, the voltage generated in the right-side portion A of the second piezoelectric body 12 and the voltage generated in the left-side portion B of the second piezoelectric body 12 cancel each other out. Hence, power generation efficiency in the second piezoelectric body 12 reduces.

Next, the case where the reciprocating vibration in the tangential direction x is applied to the piezoelectric element 10 will be described below by primarily referring to FIG. 4 and FIGS. 6A and 6B. FIG. 6A is a schematic explanatory view illustrating the direction of polarization in the portion A which is located on the right side of the straight line L1 in FIG. 4 and the stresses imposed to the right-side portion A. FIG. 6B is a schematic explanatory view illustrating the direction of polarization in the portion B which is located on the left side of the straight line L1 in FIG. 4 and the stresses imposed to the left-side portion B.

When the outer-side end 10b of the piezoelectric element 10 is displaced toward the side x2 in the tangential direction x, the right-side portion A and the left-side portion B are both deformed in a direction in which the curvature decreases. As illustrated in FIGS. 6A and 6B, therefore, compressive stress is imposed to the first piezoelectric body 11 and tensile stress is imposed to the second piezoelectric body 12 in both the right-side portion A and the left-side portion B.

Thus, when the reciprocating vibration in the tangential direction x is applied to the piezoelectric element 10, the directions of the stresses imposed to the first piezoelectric body 11 are the same on both the right side and the left side of the straight line L1. In the first embodiment, the first piezoelectric body 11 is polarized in the radial direction of the piezoelectric element 10 from the outer side toward the inner side in both the right side and the left side of the straight line L1. Accordingly, voltages having the same polarity are generated in the right-side portion A and the left-side portion B of the first piezoelectric body 11. As illustrated in FIGS. 6A and 6B, for example, when a minus voltage is generated in the right-side portion A of the first piezoelectric body 11, a minus voltage is also generated in the left-side portion B of the first piezoelectric body 11.

Further, the second piezoelectric body 12 is polarized in the radial direction of the piezoelectric element 10 from the outer side to the inner side thereof in both the right side and the left side of the straight line L1. Accordingly, voltages having the same polarity are generated in the right-side portion A and the left-side portion B of the second piezoelectric body 12. As illustrated in FIGS. 6A and 6B, for example, when a minus voltage is generated in the right-side portion A of the second piezoelectric body 12, a minus voltage is also generated in the left-side portion B of the second piezoelectric body 12.

As a result, unlike the case where the reciprocating vibration in the perpendicular direction y is applied to the outer-side end 10b of the piezoelectric element 10, the voltage generated in the right-side portion A and the voltage generated in the left-side portion B do not cancel each other out. Hence, a high level of power generation efficiency can be obtained.

As seen from the above description, when the first piezoelectric body 11 is polarized in the radial direction from one side toward the other side and the second piezoelectric body 12 is polarized in the radial direction from the other side toward the one side as in the first embodiment, a high level of power generation efficiency can be obtained by applying the reciprocating vibration in the direction x tangential to the outer-side end 10b of the piezoelectric element 10.

According to the first embodiment, as described above, the second fixing member 30 illustrated in FIG. 1 is displaceable relative to the first fixing member 20 in the tangential direction x, but the displacement of the second fixing member 30 relative to the first fixing member 20 in the perpendicular direction y is restricted with the contact surface 31a contacting the projected portion 22. Therefore, the second fixing member 30 is allowed to reciprocatingly vibrate relative to the first fixing member 20 just in a direction that is parallel to the tangential direction x. Hence, the piezoelectric power generation device 1 according to the first embodiment can realize a high level of power generation efficiency.

Further, the first and second stopper portions 32 and 33 are provided in the first embodiment. With the provision of the first and second stopper portions 32 and 33, the second fixing member 30 is restricted from excessively displacing relative to the first fixing member 20 in the tangential direction x. As a result, the piezoelectric element 10 is effectively protected against damage.

Still further, according to the first embodiment, since the piezoelectric element 10 is substantially in the spiral shape, the distance between both the fixed ends of the piezoelectric element 10 can be increased without enlarging the size of the piezoelectric power generation device 1. Stated another way, the piezoelectric element 10 having a longer size can be compactly stored in a smaller space by forming the piezoelectric element 10 substantially in the spiral shape. As a result, production of electricity by the piezoelectric power generation device 1 can be increased without enlarging the size of the piezoelectric power generation device 1. Moreover, the resonance frequency of the piezoelectric element 10 can be lowered without enlarging the size of the piezoelectric power generation device 1. It is hence possible to realize the piezoelectric power generation device 1 which has a small size and which can generate electric power even with vibrations caused by a motion of a human body, etc. at frequencies as low as about 20 Hz or less, for example.

In addition, since the piezoelectric element 10 is substantially in the spiral shape, stresses are less apt to concentrate in a particular portion of the piezoelectric element 10. Consequently, the piezoelectric element 10 is less susceptible to damage with vibrations of the piezoelectric element 10.

Furthermore, according to the first embodiment, since the first and second piezoelectric bodies 11 and 12 are each polarized in the radial direction of the piezoelectric element 10, the first to third electrodes 13 to 15 and the lead wires 16a to 16c can be formed in simple constructions.

Second Embodiment

The first embodiment has been described above in connection with the case where the projected portion 22 is formed on the first fixing member 20 and the contact surface 31a is formed in the second fixing member 30 such that the second fixing member 30 is displaceable in the tangential direction x relative to the first fixing member 20, but the displacement of the second fixing member 30 in the perpendicular direction y relative to the first fixing member 20 is restricted with the contact surface 31a contacting the projected portion 22. However, the present invention is not limited to the above-described arrangement. For example, a plurality of piezoelectric elements 10 may be arranged such that the second fixing member 30 is displaceable in the tangential direction x relative to the first fixing member 20, but the second fixing member 30 is restricted from displacing in the perpendicular direction y relative to the first fixing member 20. Examples of such an arrangement will be described below in second and third embodiments. Be it noted that, in the following descriptions of the second and third embodiments, components having functions substantially common to those of the components in the first embodiment are denoted by common reference characters and descriptions of those components are omitted. Also, FIGS. 2 to 6 are continuously referred to in the following descriptions of the second and third embodiments in common.

Figure 7:
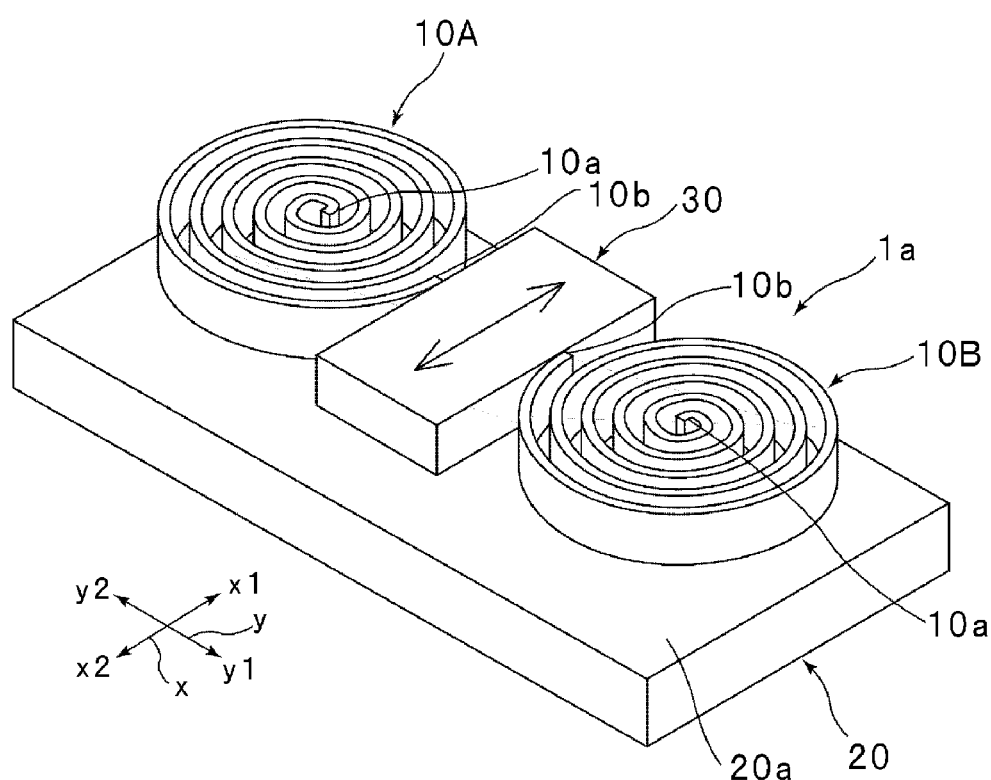
FIG. 7 is a schematic perspective view of a piezoelectric power generation device according to a second embodiment.
Figure 8:
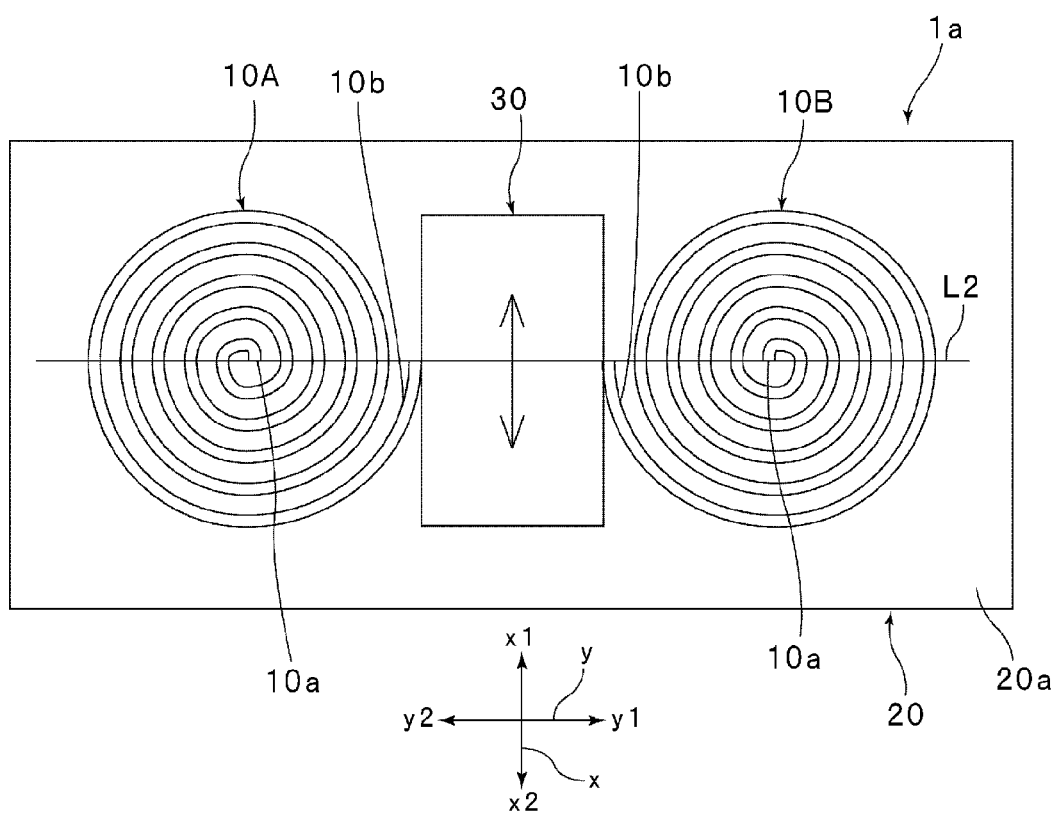
FIG. 8 is a schematic plan view of the piezoelectric power generation device according to the second embodiment.

FIG. 7 is a schematic perspective view of a piezoelectric power generation device 1a according to the second embodiment. FIG. 8 is a schematic plan view of the piezoelectric power generation device 1a according to the second embodiment. As illustrated in FIGS. 7 and 8, the piezoelectric power generation device 1a according to the second embodiment includes two piezoelectric elements 10. In the second embodiment, of the two piezoelectric elements 10, one on the side y2 is called a piezoelectric element 10A and the other on the side y1 is called a piezoelectric element 10B.

In the second embodiment, the piezoelectric element 10A and the piezoelectric element 10B have substantially the same structure. Therefore, the resonance frequency of the piezoelectric element 10A and the resonance frequency of the piezoelectric element 10B are equal to each other.

The piezoelectric element 10A and the piezoelectric element 10B are arranged so as to line up in the perpendicular direction y. The piezoelectric element 10A and the piezoelectric element 10B are arranged on the surface 20a of the first fixing member 20 in such a state that winding directions of their spirals are opposed to each other. Herein, the term "winding direction of the piezoelectric element" means the direction in which the piezoelectric element extends from the center-side end toward the outer-side end thereof. Thus, the winding direction of each piezoelectric element having substantially the spiral shape is right-handed or left-handed. In the second embodiment, as viewed from above the surface 20a of the first fixing member 20, the winding direction of the piezoelectric element 10A is left-handed (i.e., counterclockwise) and the winding direction of the piezoelectric element 10B is right-handed (i.e., clockwise).

The second fixing member 30 is arranged on the surface 20a of the first fixing member 20 between the piezoelectric element 10A and the piezoelectric element 10B. The second fixing member 30 is displaceable relative to the first fixing member 20 at least in the planar direction of the first fixing member 20. In the second embodiment, the second fixing member 30 is displaceable relative to the first fixing member 20 in the planar direction of the first fixing member 20 and a direction normal to the surface 20a of the first fixing member 20. Thus, in the second embodiment, the second fixing member 30 is not fixed to the first fixing member 20.

The second fixing member 30 is fixed to both the piezoelectric element 10A and the piezoelectric element 10B. Specifically, a portion of the piezoelectric element 10A, which is positioned closest to the piezoelectric element 10B, and a portion of the piezoelectric element 10B, which is positioned closest to the piezoelectric element 10A, are fixed to the second fixing member 30 on a straight line L2 (see FIG. 8) that passes a center of the piezoelectric element 10A and a center of the piezoelectric element 10B. In more detail, in the second embodiment, an outer-side end 10b of the piezoelectric element 10A is positioned closest to the piezoelectric element 10B on the straight line L2, and an outer-side end 10b of the piezoelectric element 10B is positioned closest to the piezoelectric element 10A on the straight line L2. Therefore, the outer-side end 10b of the piezoelectric element 10A and the outer-side end 10b of the piezoelectric element 10B are fixed to the second fixing member 30.

With such an arrangement, the second fixing member 30 is restricted from displacing relative to the first fixing member 20 in the perpendicular direction y. On the other hand, the second fixing member 30 is displaceable relative to the first fixing member 20 in the tangential direction x. Thus, in the second embodiment, the piezoelectric element 10B provided in addition to the piezoelectric element 10A functions as a restriction member for restricting the displacement of the second fixing member 30 relative to the first fixing member 20 in the perpendicular direction y, like the projected portion 22 in the first embodiment. Accordingly, the outer-side end 10b of the piezoelectric element 10A and the outer-side end 10b of the piezoelectric element 10B are both displaceable just in the tangential direction x relative to the first fixing member 20 to which a center-side end 10a of the piezoelectric element 10A and a center-side end 10a of the piezoelectric element 10B are fixed. As a result, a high level of power generation efficiency can be realized as in the first embodiment.

According to the second embodiment, in particular, since two piezoelectric elements 10A and 10B are provided within one piezoelectric power generation device 1a, a higher level of power generation efficiency can be realized without enlarging the size of the piezoelectric power generation device 1a.

Further, fixing two piezoelectric elements 10 to the second fixing member 30 as in the second embodiment means that the second fixing member 30 is fixed at two ends. Therefore, the displacement of the second fixing member 30 relative to the first fixing member 20 in the tangential direction x can be stabilized.

Particularly, according to the second embodiment, since the resonance frequency of the piezoelectric element 10A and the resonance frequency of the piezoelectric element 10B are equal to each other, the displacement of the second fixing member 30 relative to the first fixing member 20 in the tangential direction x can be more stabilized. Hence, the displacement of the second fixing member 30 relative to the first fixing member 20 can be increased. As a result, a higher level of power generation efficiency can be realized.

Further, according to the second embodiment, since the outer-side end 10b of the piezoelectric element 10A and the outer-side end 10b of the piezoelectric element 10B are fixed to the second fixing member 30, the entirety of the piezoelectric elements 10A and 10B is deformed to a larger extent upon the second fixing member 30 displacing relative to the first fixing member 20. As a result, a higher level of power generation efficiency can be realized.

Additionally, when a plurality of piezoelectric elements 10 are provided as in the second embodiment, the stress imposed to one piezoelectric element can be reduced. Hence, the piezoelectric element 10 can be effectively protected against damage.

Third Embodiment

The second embodiment has been described in connection with the case where the piezoelectric element 10 is provided two. In more detail, the second embodiment has been described in connection with the case of providing one piezoelectric element pair which includes two piezoelectric elements 10 having the winding directions opposed to each other. However, the present invention is not limited to such an arrangement.

Figure 9:
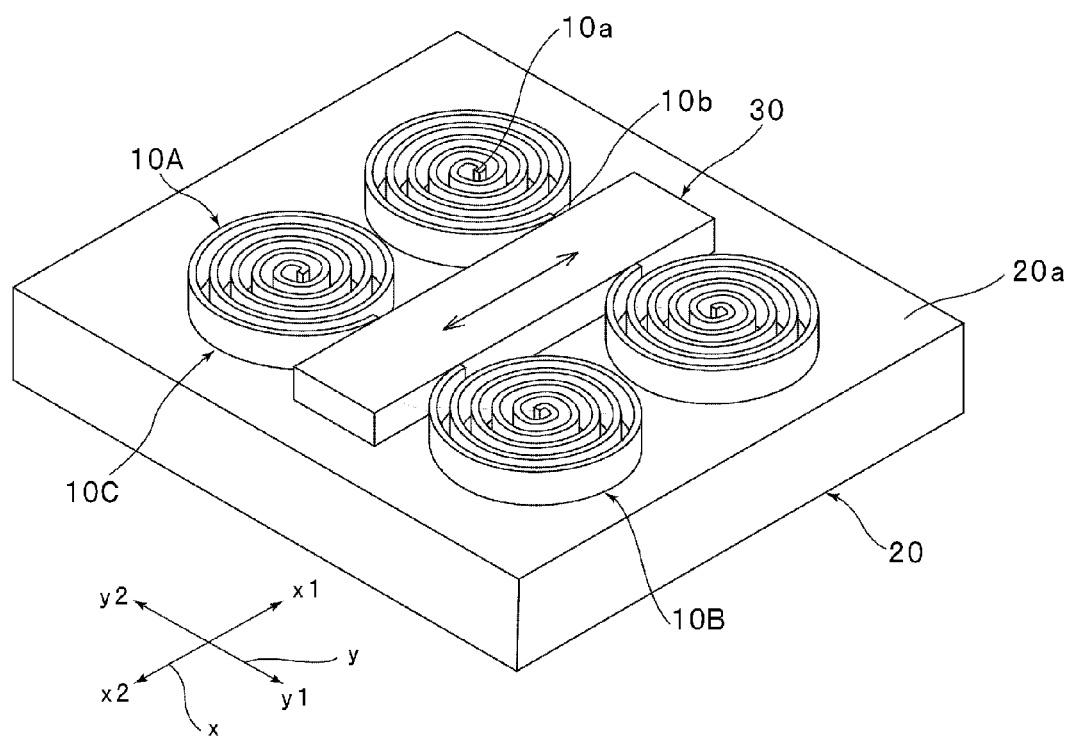
FIG. 9 is a schematic perspective view of a piezoelectric power generation device according to a third embodiment.

As illustrated in FIG. 9, by way of example, a piezoelectric element pair 10C made up of the piezoelectric element 10A and the piezoelectric element 10B, which have the winding directions opposed to each other, may be provided so as to lie side by side in the tangential direction x. More specifically, in a third embodiment illustrated in FIG. 9, the piezoelectric element pair 10C is provided so as to lie side by side in the tangential direction x. The third embodiment can also realize a higher level of power generation efficiency as in the second embodiment described above.

According to the third embodiment, in particular, since four piezoelectric elements 10 are provided within one piezoelectric power generation device, an even higher level of power generation efficiency can be realized without enlarging the size of the piezoelectric power generation device.

Fourth Embodiment

Figure 10:
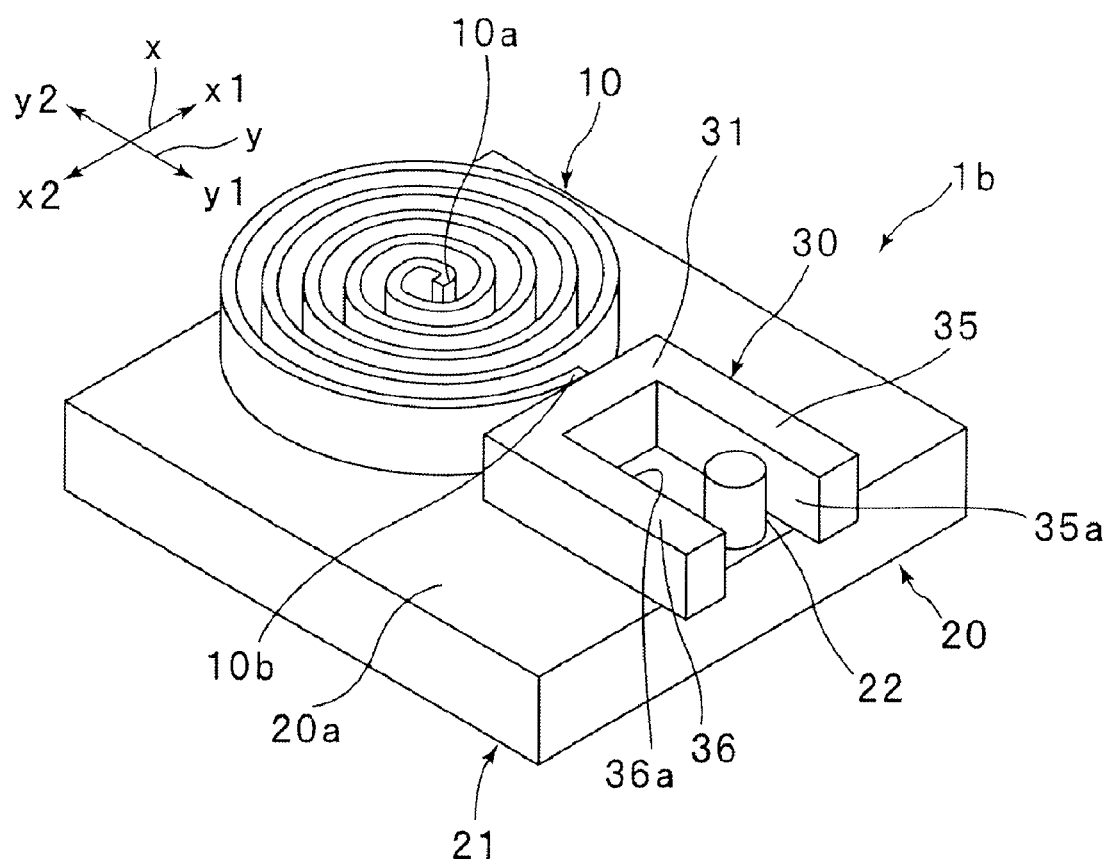
FIG. 10 is a schematic perspective view of a piezoelectric power generation device according to a fourth embodiment.

FIG. 10 is a schematic perspective view of a piezoelectric power generation device 1b according to a fourth embodiment. As illustrated in FIG. 10, the piezoelectric power generation device 1b includes a piezoelectric element 10 and first and second fixing members 20 and 30. The piezoelectric power generation device 1b generates electric power by utilizing vibration of the piezoelectric element 10 in the d31 mode.

The piezoelectric element 10 is formed substantially in a spiral (coiled) shape. More specifically, the piezoelectric element 10 helically extends from a center of the spiral in the tangential direction perpendicular to the radial direction while gradually increasing the diameter of the spiral. A width W (see FIG. 12) of the piezoelectric element 10 is smaller than a height H (see FIG. 12) of the piezoelectric element 10.

Figure 11:
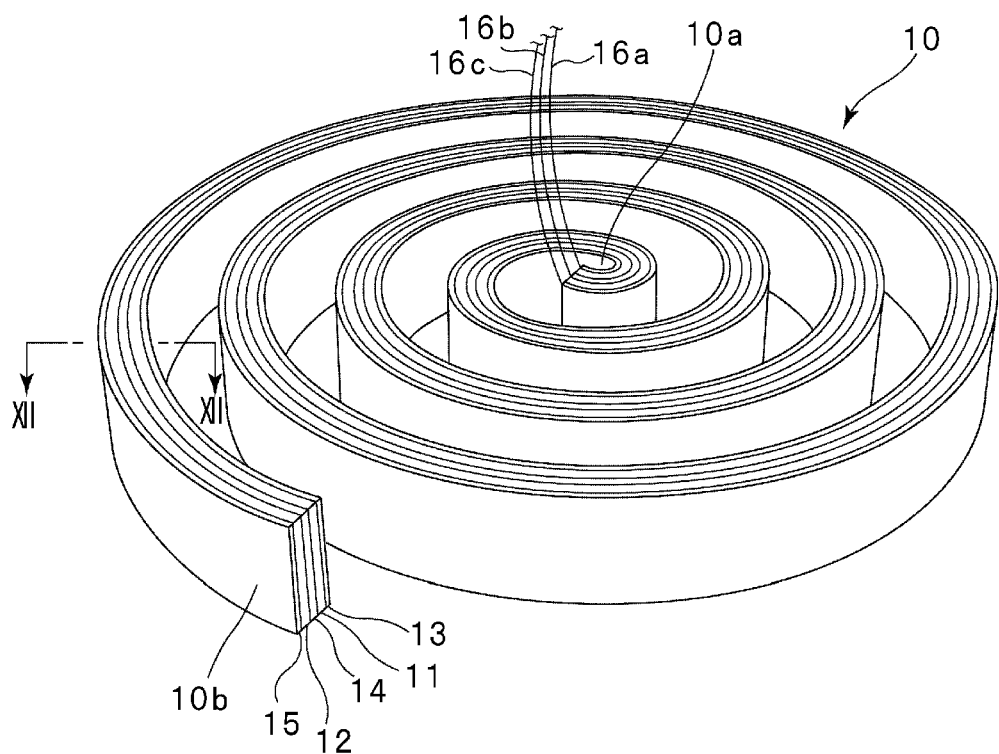
FIG. 11 is a schematic perspective view of a piezoelectric element in the fourth embodiment.
Figure 12:
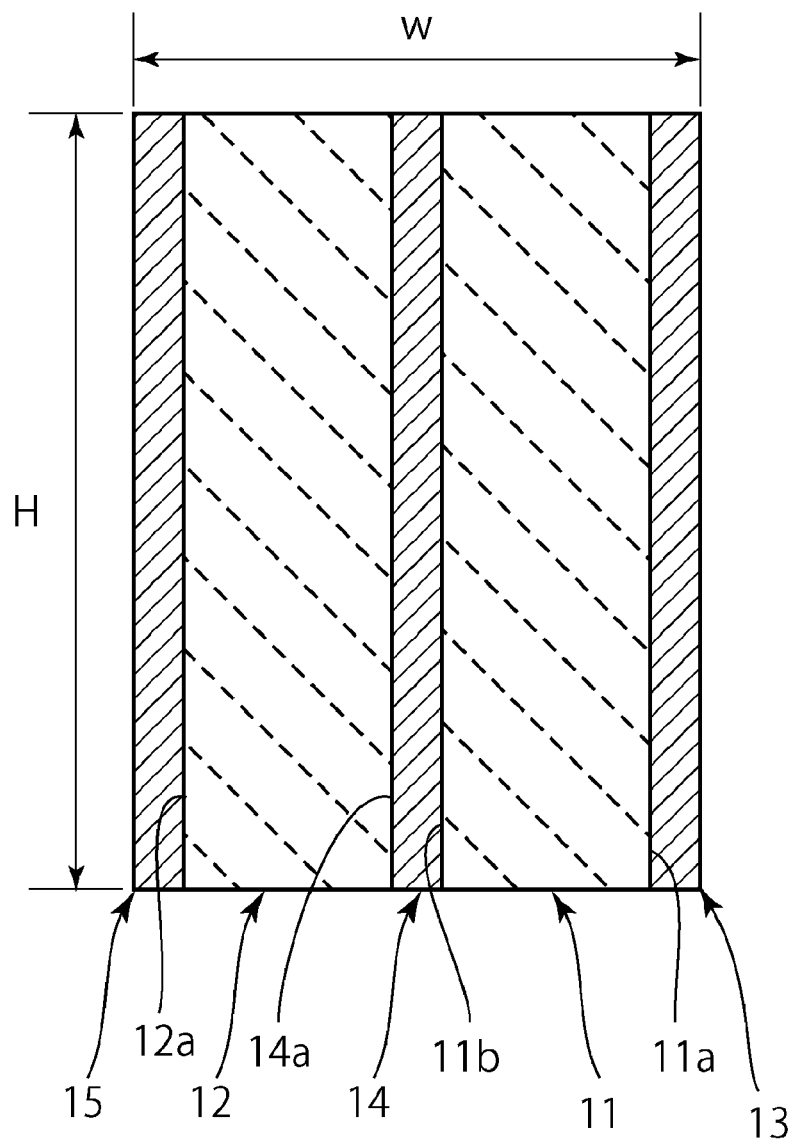
FIG. 12 is a schematic sectional view of a portion cut out along a cut line XII-XII in FIG. 11.

As illustrated in FIGS. 11 and 12, the piezoelectric element 10 includes first and second piezoelectric bodies 11 and 12, and first to third electrodes 13, 14 and 15. The first piezoelectric body 11 is formed substantially in the spiral shape. As illustrated in FIG. 12, a first electrode 13 is formed on an inner surface 11a of the first piezoelectric body 11 as viewed in the radial direction. On the other hand, a second electrode 14 is formed on an outer surface 11b of the first piezoelectric body 11 as viewed in the radial direction. A second piezoelectric body 12 is disposed on an outer surface 14a of the second electrode 14 as viewed in the radial direction. A third electrode 15 is formed on an outer surface 12a of the second piezoelectric body 12 as viewed in the radial direction. Stated another way, the first electrode 13, the first piezoelectric body 11, the second electrode 14, the second piezoelectric body 12, and the third electrode 15 are successively formed in the named order in the radial direction of the piezoelectric element 10 from the inner side toward the outer side thereof. Thus, the first piezoelectric body 11 is sandwiched between the first electrode 13 and the second electrode 14. Electric power generated in the first piezoelectric body 11 is taken out through a lead wire 16a (see FIG. 11) connected to the first electrode 13 and a lead wire 16b (see FIG. 11) connected to the second electrode 14. On the other hand, the second piezoelectric body 12 is sandwiched between the second electrode 14 and the third electrode 15. Electric power generated in the second piezoelectric body 12 is taken out through the lead wire 16b (see FIG. 11) connected to the second electrode 14 and a lead wire 16c (see FIG. 11) connected to the third electrode 15.

The first to third electrodes 13 to 15 are each formed of a suitable conductive material. The first to third electrodes 13 to 15 can be each formed of, for example, one of metals, such as Al, Ag, Cu, Pt, Au, Cr and Ni, or an alloy containing one or more of those metals.

The first and second piezoelectric bodies 11 and 12 are each formed of a suitable piezoelectric material. The first and second piezoelectric bodies 11 and 12 can be each formed of, for example, a piezoelectric ceramic such as a lead zirconate titanate-based ceramic.

Figure 13:
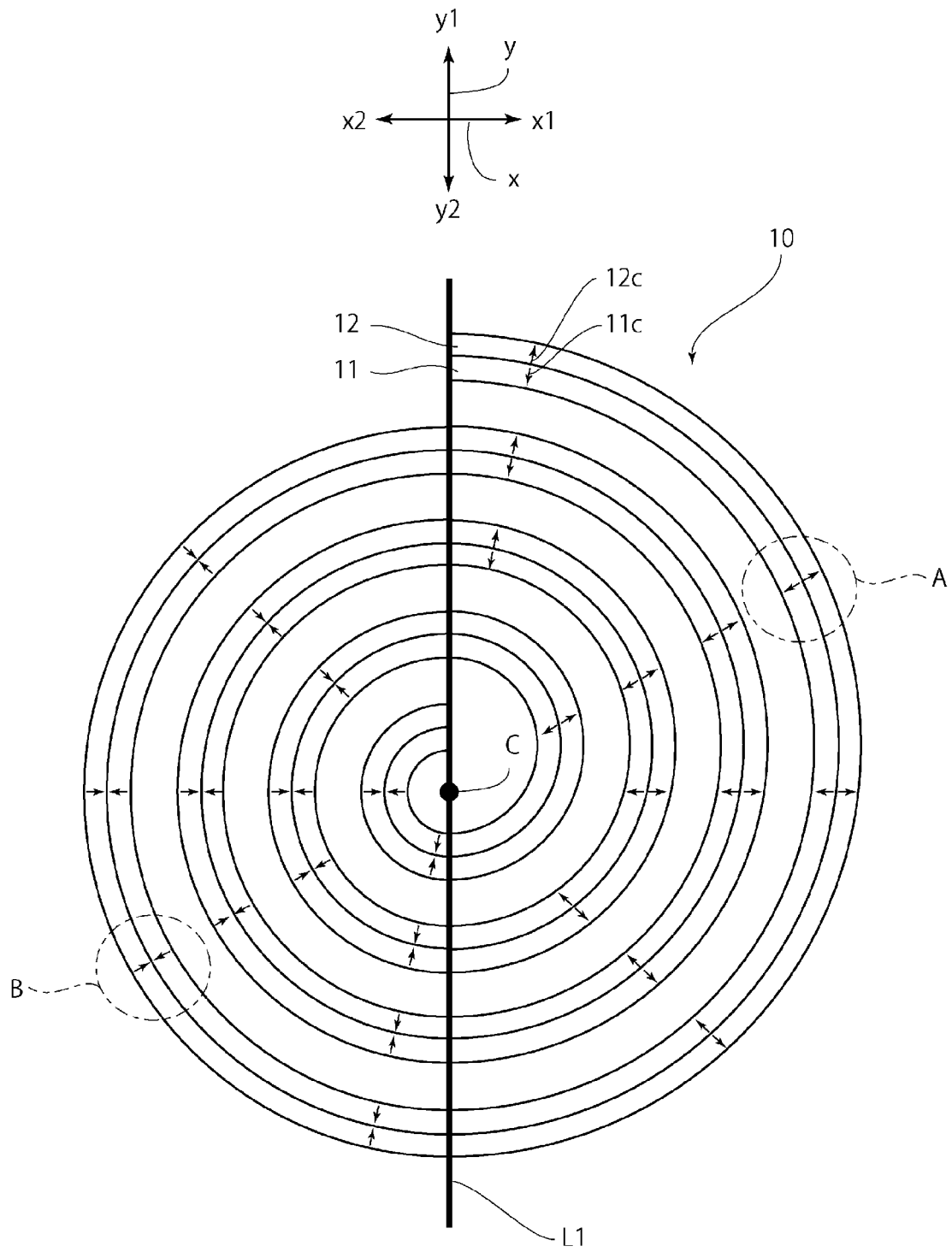
FIG. 13 is a schematic plan view to explain the direction of polarization in the piezoelectric element in the fourth embodiment (first to third electrodes are omitted in FIG. 13 for convenience in drawing the figure)

FIG. 13 is a schematic plan view to explain the direction of polarization in each of the first and second piezoelectric bodies 11 and 12. Be it noted that, in FIG. 13, the direction of polarization in each of the first and second piezoelectric bodies 11 and 12 is indicated by an arrow.

As illustrated in FIG. 13, the direction 11c of polarization in the first piezoelectric body 11 and the direction 12c of polarization in the second piezoelectric body 12 are both oriented in the radial direction of the piezoelectric element 10. The direction 11c of polarization in the first piezoelectric body 11 and the direction 12c of polarization in the second piezoelectric body 12 are opposed to each other. Further, in the fourth embodiment, the direction of polarization is reversed between one portion of the first piezoelectric body 11, which is located on one side of a straight line L1 passing the center of the piezoelectric element 10 and the outer-side end of the piezoelectric element 10, and the other portion of the first piezoelectric body 11, which is located on the other side of the straight line L1. Also, the direction of polarization is reversed between one portion of the second piezoelectric body 12, which is located on the one side of the straight line L1, and the other portion of the second piezoelectric body 12, which is located on the other side of the straight line L1.

More specifically, as illustrated in FIG. 13, the direction 11c of polarization in a portion of the first piezoelectric body 11, which is located on the right side of the straight line L1, is oriented in the radial direction of the piezoelectric element 10 from one side toward the other side. On the other hand, as illustrated in FIG. 13, the direction 11c of polarization in a portion of the first piezoelectric body 11, which is located on the left side of the straight line L1, is oriented in the radial direction of the piezoelectric element 10 from the other side toward the one side. As one practical example, in the fourth embodiment, the direction 11c of polarization in the portion of the first piezoelectric body 11, which is located on the right side of the straight line L1, is oriented inwards in the radial direction and the direction 11c of polarization in the portion of the first piezoelectric body 11, which is located on the left side of the straight line L1, is oriented outwards in the radial direction.

Further, as illustrated in FIG. 13, the direction 12c of polarization in a portion of the second piezoelectric body 12, which is located on the right side of the straight line L1, is oriented in the radial direction of the piezoelectric element 10 from the other side toward the one side. On the other hand, as illustrated in FIG. 13, the direction 12c of polarization in a portion of the second piezoelectric body 12, which is located on the left side of the straight line L1, is oriented in the radial direction of the piezoelectric element 10 from the one side toward the other side. As one practical example, in the fourth embodiment, the direction 12c of polarization in the portion of the second piezoelectric body 12, which is located on the right side of the straight line L1, is oriented outwards in the radial direction and the direction 12c of polarization in the portion of the second piezoelectric body 12, which is located on the left side of the straight line L1, is oriented inwards in the radial direction.

A method of polarizing the first and second piezoelectric bodies 11 and 12 as in the fourth embodiment is not limited to a particular one. For example, the first and second piezoelectric bodies 11 and 12 can be polarized as follows. First, the piezoelectric element 10 is formed in such a state that the first to third electrodes 13 to 15 are each cut between the right side and the left side of the straight line L1 illustrated in FIG. 13. In that state, the first and second piezoelectric bodies 11 and 12 are each polarized as desired. Thereafter, cut right and left portions of each of the first to third electrodes 13 to 15 are interconnected.

As illustrated in FIG. 10, the piezoelectric element 10 is disposed on a surface 20a of a plate-like first fixing member 20. A center-side end 10a of the piezoelectric element 10 is fixed to the first fixing member 20. Meanwhile, an outer-side end 10b of the piezoelectric element 10 is not fixed to the first fixing member 20, but it is fixed to a second fixing member 30.

A method of fixing the piezoelectric element 10 to the first and second fixing members 20 and 30 is not limited to a particular one. The piezoelectric element 10 may be fixed to the first and second fixing members 20 and 30, for example, by welding or by using an adhesive, bolts, etc.

The second fixing member 30 is displaceable relative to the first fixing member 20 in a direction y perpendicular to the outer-side end 10b of the piezoelectric element 10, i.e., in a direction in which the straight line L1 extends. On the other hand, the second fixing member 30 is restricted from displacing relative to the first fixing member 20 in a tangential direction x.

More specifically, the first fixing member 20 includes a plate-like member 21 and a projected portion 22. The center-side end 10a of the piezoelectric element 10 is fixed to one surface of the plate-like member 21. The projected portion 22 is formed on the one surface of the plate-like member 21. The projected portion 22 is projected from the one surface of the plate-like member 21 in a direction normal to that one surface at a position outwards of the outer-side end 10b of the piezoelectric element 10 as viewed in the radial direction.

While the projected portion 22 is substantially columnar (cylindrical) in the fourth embodiment, the shape of the projected portion 22 is not limited to a column. The projected portion 22 may have substantially the shape of a triangular prism, a polygonal column, a cone, or a truncated cone, for example. Further, the projected portion 22 and the plate-like member 21 may be integral with each other or separate from each other.

The second fixing member 30 is disposed on the first fixing member 20. The second fixing member 30 includes a fixing member body 31 and first and second guide portions 35 and 36. The outer-side end 10b of the piezoelectric element 10 is connected to the fixing member body 31. The fixing member body 31 is positioned between the outer-side end 10b of the piezoelectric element 10 and the projected portion 22.

Each of the first and second guide portions 35 and 36 extends parallel to the perpendicular direction y from the fixing member body 31 toward the side y1 in the perpendicular direction y. The first guide portion 35 is positioned on the side x1 in the tangential direction x with respect to the projected portion 22. On the other hand, the second guide portion 36 is positioned on the side x2 in the tangential direction x with respect to the projected portion 22. In the fourth embodiment, the first and second guide portions 35 and 36 are held in contact at their contact surfaces 35a and 36a with the projected portion 22.

In the fourth embodiment, therefore, the second fixing member 30 and the outer-side end 10b of the piezoelectric element 10, which is fixed to the second fixing member 30, are displaceable in the perpendicular direction y relative to the first fixing member 20 and the center-side end 10a of the piezoelectric element 10, which is fixed to the first fixing member 20, but they are not displaceable in the tangential direction x.

While the fourth embodiment is described, by way of example, in connection with the case where the first and second guide portions 35 and 36 are each held in contact with the projected portion 22, a clearance may be left between each of the first and second guide portions 35 and 36 and the projected portion 22. When a clearance is left between each of the first and second guide portions 35 and 36 and the projected portion 22, the second fixing member 30 is apt to displace in the tangential direction x relative to the first fixing member 20. In such a case, therefore, the size of the clearance between each of the first and second guide portions 35 and 36 and the projected portion 22 is preferably set to be about 0.2 mm or less.

In the piezoelectric power generation device 1b according to the fourth embodiment, when vibration is applied to the piezoelectric power generation device 1b, stresses are imposed to the first and second piezoelectric bodies 11 and 12, thus causing the first and second piezoelectric bodies 11 and 12 to deform. As a result, electric power is generated in the first and second piezoelectric bodies 11 and 12 and is taken out through the first to third electrodes 13 to 15.

Linear reciprocating vibrations applied to the piezoelectric power generation device 1b include vibration reciprocating in the tangential direction x illustrated in FIG. 13, vibration reciprocating in the perpendicular direction y that is perpendicular to the tangential direction x, and vibration reciprocating in a direction inclined to both the tangential direction x and the perpendicular direction y. The vibration reciprocating in the direction inclined to both the tangential direction x and the perpendicular direction y can be regarded as a resultant vibration of the vibration in the tangential direction x and the vibration in the perpendicular direction y. Therefore, the linear reciprocating vibrations applied to the piezoelectric power generation device 1b can be essentially divided into two main vibrations, i.e., the vibration in the tangential direction x and the vibration in the perpendicular direction y.

Figure 14A:
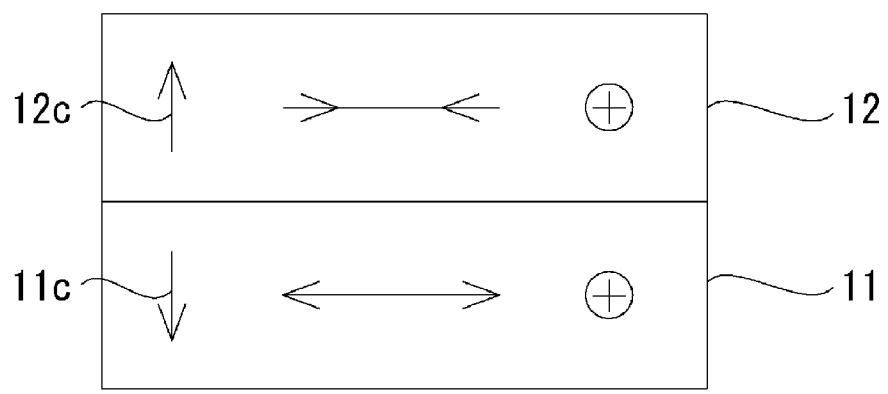
FIGS. 14A and 14B are each a schematic explanatory view of the piezoelectric element when reciprocating vibration in the perpendicular direction y is applied to the piezoelectric element in the fourth embodiment; specifically
Figure 14B:
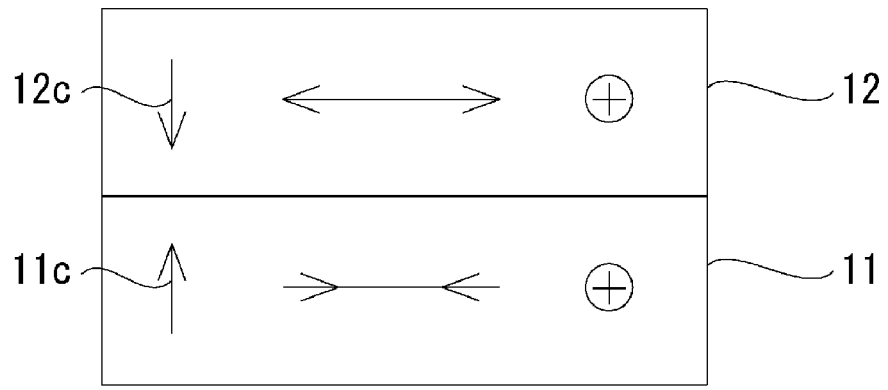
Figure 15A:
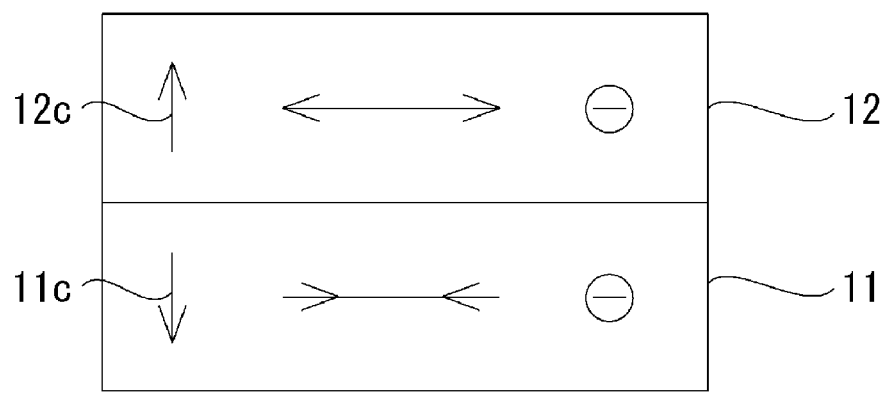
FIGS. 15A and 15B are each a schematic explanatory view of the piezoelectric element when reciprocating vibration in the tangential direction x is applied to the piezoelectric element in the fourth embodiment; specifically
Figure 15B:
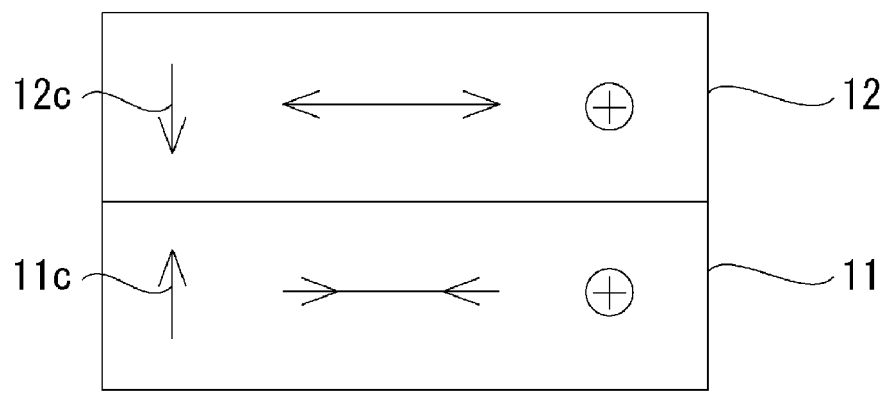

For example, when the reciprocating vibration in the perpendicular direction y is applied to the piezoelectric element 10, different stresses are imposed to the first and second piezoelectric bodies 11 and 12 between the right side and the left side of the straight line L1 passing the center C of the piezoelectric element 10 and the outer-side end 10b of the piezoelectric element 10. FIGS. 14A and 14B illustrate the stresses imposed to a portion A which is located on the right side of the straight line L1 in FIG. 13 and the stresses imposed to a portion B which is located on the left side of the straight line L1 in FIG. 13, respectively, when the outer-side end 10b of the piezoelectric element 10 is displaced toward the side y1 in the perpendicular direction y. Also, FIGS. 15A and 15B illustrate the stresses imposed to the portion A which is located on the right side of the straight line L1 in FIG. 13 and the stresses imposed to the portion B which is located on the left side of the straight line L1 in FIG. 13, respectively, when the outer-side end 10b of the piezoelectric element 10 is displaced toward the side x2 in the tangential direction x.

First, the case where the reciprocating vibration in the perpendicular direction y is applied to the piezoelectric element 10 will be described below by primarily referring to FIG. 13 and FIGS. 14A and 14B. FIG. 14A is a schematic explanatory view illustrating the direction of polarization in the portion A which is located on the right side of the straight line L1 in FIG. 13 and the stresses imposed to the right-side portion A. FIG. 14B is a schematic explanatory view illustrating the direction of polarization in the portion B which is located on the left side of the straight line L1 in FIG. 13 and the stresses imposed to the left-side portion B.

When the outer-side end 10b of the piezoelectric element 10 is displaced toward the side y1 in the perpendicular direction y, the right-side portion A is deformed in a direction in which the curvature increases. As illustrated in FIG. 14A, therefore, tensile stress is imposed to the first piezoelectric body 11 and compressive stress is imposed to the second piezoelectric body 12.

Also, when the outer-side end 10b of the piezoelectric element 10 is displaced toward the side y1 in the perpendicular direction y, the left-side portion B is deformed in a direction in which the curvature decreases. As illustrated in FIG. 14B, therefore, compressive stress is imposed to the first piezoelectric body 11 and tensile stress is imposed to the second piezoelectric body 12.

Thus, when the reciprocating vibration in the perpendicular direction y is applied to the piezoelectric element 10, the directions of the stresses imposed to the first piezoelectric body 11 are opposed between the right side and the left side of the straight line L1. In the fourth embodiment, the direction 11c of polarization in the first piezoelectric body 11 is reversed between the right side and the left side of the straight line L1. Accordingly, voltages having the same polarity are generated in the right-side portion A and the left-side portion B of the first piezoelectric body 11. As illustrated in FIGS. 14A and 14B, for example, when a plus voltage is generated in the right-side portion A of the first piezoelectric body 11, a plus voltage is also generated in the left-side portion B of the first piezoelectric body 11. As a result, the voltage generated in the right-side portion A and the voltage generated in the left-side portion B do not cancel each other out, whereby a high level of power generation efficiency can be obtained.

Similarly, when the reciprocating vibration in the perpendicular direction y is applied to the piezoelectric element 10, the directions of the stresses imposed to the second piezoelectric body 12 are opposed between the right side and the left side of the straight line L1. In the fourth embodiment, the direction 12c of polarization in the second piezoelectric body 12 is reversed between the right side and the left side of the straight line L1. Accordingly, voltages having the same polarity are generated in the right-side portion A and the left-side portion B of the second piezoelectric body 12. As illustrated in FIGS. 14A and 14B, for example, when a plus voltage is generated in the right-side portion A of the second piezoelectric body 12, a plus voltage is also generated in the left-side portion B of the second piezoelectric body 12. As a result, the voltage generated in the right-side portion A and the voltage generated in the left-side portion B do not cancel each other out, whereby a high level of power generation efficiency can be obtained.

Next, the case where the reciprocating vibration in the tangential direction x is applied to the piezoelectric element 10 will be described below by primarily referring to FIG. 13 and FIGS. 15A and 15B. FIG. 15A is a schematic explanatory view illustrating the direction of polarization in the portion A which is located on the right side of the straight line L1 in FIG. 13 and the stresses imposed to the right-side portion A. FIG. 15B is a schematic explanatory view illustrating the direction of polarization in the portion B which is located on the left side of the straight line L1 in FIG. 13 and the stresses imposed to the left-side portion B.

When the outer-side end 10b of the piezoelectric element 10 is displaced toward the side x2 in the tangential direction x, the right-side portion A and the left-side portion B are both deformed in a direction in which the curvature decreases. As illustrated in FIGS. 15A and 15B, therefore, compressive stress is imposed to the first piezoelectric body 11 and tensile stress is imposed to the second piezoelectric body 12 in both the right-side portion A and the left-side portion B.

Thus, when the reciprocating vibration in the tangential direction x is applied to the piezoelectric element 10, the directions of the stresses imposed to the first piezoelectric body 11 are the same on both the right side and the left side of the straight line L1. In the fourth embodiment, the direction 11c of polarization in the first piezoelectric body 11 is reversed between the right side and the left side of the straight line L1. Accordingly, voltages having different polarities are generated in the right-side portion A and the left-side portion B of the first piezoelectric body 11. As illustrated in FIGS. 15A and 15B, for example, when a minus voltage is generated in the right-side portion A of the first piezoelectric body 11, a plus voltage is generated in the left-side portion B of the first piezoelectric body 11.

Further, the direction 12c of polarization in the second piezoelectric body 12 is reversed between the right side and the left side of the straight line L1. Accordingly, voltages having different polarities are generated in the right-side portion A and the left-side portion B of the second piezoelectric body 12. As illustrated in FIGS. 15A and 15B, for example, when a minus voltage is generated in the right-side portion A of the second piezoelectric body 12, a plus voltage is generated in the left-side portion B of the second piezoelectric body 12.

Thus, the voltage generated in the right-side portion A and the voltage generated in the left-side portion B cancel each other out, whereby a high level of power generation efficiency cannot be obtained.

As seen from the above description, in the fourth embodiment, a high level of power generation efficiency can be obtained by applying the reciprocating vibration in the direction y perpendicular to the outer-side end 10b of the piezoelectric element 10.

According to the fourth embodiment, as described above, the second fixing member 30 illustrated in FIG. 10 is displaceable in the perpendicular direction y relative to the first fixing member 20, but the displacement of the second fixing member 30 in the tangential direction x relative to the first fixing member 20 is restricted with the contact surface 35a and 36a contacting the projected portion 22. Therefore, the second fixing member 30 is allowed to reciprocatingly vibrate relative to the first fixing member 20 just in a direction that is parallel to the perpendicular direction y. Hence, the piezoelectric power generation device 1b according to the fourth embodiment can realize a high level of power generation efficiency.

Further, according to the fourth embodiment, with the fixing member body 31 arranged in opposed relation to the projected portion 22, the second fixing member 30 is restricted from excessively displacing toward the side y1 in the perpendicular direction y relative to the first fixing member 20. As a result, the piezoelectric element 10 is not excessively deformed even when large vibration is applied to the piezoelectric element 10. Hence, the piezoelectric element 10 is effectively protected against damage.

Still further, according to the fourth embodiment, since the piezoelectric element 10 is substantially in the spiral shape, the distance between both the fixed ends of the piezoelectric element 10 can be increased without enlarging the size of the piezoelectric power generation device 1b. Stated another way, the piezoelectric element 10 having a longer size can be compactly stored in a smaller space by forming the piezoelectric element 10 substantially in the spiral shape. As a result, production of electricity by the piezoelectric power generation device 1b can be increased without enlarging the size of the piezoelectric power generation device 1b. Moreover, the resonance frequency of the piezoelectric element 10 can be lowered without enlarging the size of the piezoelectric power generation device 1b. It is hence possible to realize the piezoelectric power generation device 1b which has a small size and which can generate electric power even with vibrations caused by a motion of a human body, etc. at frequencies as low as about 20 Hz or less, for example.

In addition, since the piezoelectric element 10 is substantially in the spiral shape, stresses are less apt to concentrate in a particular portion of the piezoelectric element 10. Consequently, the piezoelectric element 10 is less susceptible to damage with vibrations of the piezoelectric element 10.

Fifth Embodiment

The fourth embodiment has been described above in connection with the case where the projected portion 22 is formed on the first fixing member 20 and the first and second guide portions 35 and 36 are formed as part of the second fixing member 30 such that the second fixing member 30 is displaceable in the perpendicular direction y relative to the first fixing member 20, but the second fixing member 30 is restricted from displacing in the tangential direction x relative to the first fixing member 20. However, the present invention is not limited to the above-described arrangement. For example, a plurality of piezoelectric elements 10 may be arranged such that the second fixing member 30 is displaceable in the perpendicular direction y relative to the first fixing member 20, but the second fixing member 30 is restricted from displacing in the tangential direction x relative to the first fixing member 20. One example of such an arrangement will be described below in a fifth embodiment. Be it noted that, in the following description of the fifth embodiment, components having functions substantially common to those of the components in the fourth embodiment are denoted by common reference characters and descriptions of those components are omitted. Also, FIGS. 11 to 15 are continuously referred to in the following description of the fifth embodiment in common.

Figure 16:
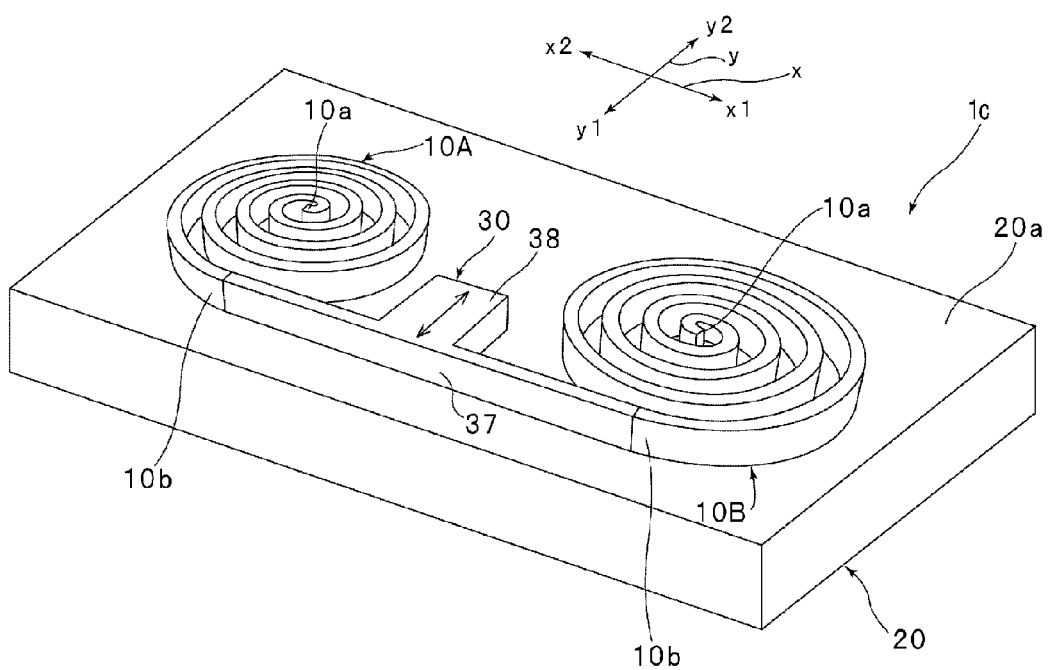
FIG. 16 is a schematic perspective view of a piezoelectric power generation device according to a fifth embodiment.

FIG. 16 is a schematic perspective view of a piezoelectric power generation device 1c according to the fifth embodiment. As illustrated in FIG. 16, the piezoelectric power generation device 1c according to the fifth embodiment includes two piezoelectric elements 10. In the fifth embodiment, of the two piezoelectric elements 10, one on the side x2 is called a piezoelectric element 10A and the other on the side x1 is called a piezoelectric element 10B.

In the fifth embodiment, the piezoelectric element 10A and the piezoelectric element 10B have substantially the same structure. Therefore, the resonance frequency of the piezoelectric element 10A and the resonance frequency of the piezoelectric element 10B are equal to each other.

The piezoelectric element 10A and the piezoelectric element 10B are arranged so as to line up in the tangential direction x. The piezoelectric element 10A and the piezoelectric element 10B are arranged on the surface 20a of the first fixing member 20 in such a state that winding directions of their spirals are opposed to each other. Herein, the term "winding direction of the piezoelectric element" means the direction in which the piezoelectric element extends from the center-side end toward the outer-side end thereof. Thus, the winding direction of each piezoelectric element having substantially the spiral shape is right-handed or left-handed. In the fifth embodiment, as viewed from above the surface 20a of the first fixing member 20, the winding direction of the piezoelectric element 10A is left-handed (i.e., counterclockwise) and the winding direction of the piezoelectric element 10B is right-handed (i.e., clockwise).

In the fifth embodiment, the direction of polarization in a portion of the first piezoelectric body 11 of the piezoelectric element 10A, which is located on the side x1 with respect to the straight line L1, and the direction of polarization in a portion of the first piezoelectric body 11 of the piezoelectric element 10B, which is located on the side x2 with respect to the straight line L1, are equal to each other. The direction of polarization in a portion of the first piezoelectric body 11 of the piezoelectric element 10A, which is located on the side x2 with respect to the straight line L1, and the direction of polarization in a portion of the first piezoelectric body 11 of the piezoelectric element 10B, which is located on the side x1 with respect to the straight line L1, are equal to each other. Further, the direction of polarization in a portion of the second piezoelectric body 12 of the piezoelectric element 10A, which is located on the side x1 with respect to the straight line L1, and the direction of polarization in a portion of the second piezoelectric body 12 of the piezoelectric element 10B, which is located on the side x2 with respect to the straight line L1, are equal to each other. The direction of polarization in a portion of the second piezoelectric body 12 of the piezoelectric element 10A, which is located on the side x2 with respect to the straight line L1, and the direction of polarization in a portion of the second piezoelectric body 12 of the piezoelectric element 10B, which is located on the side x1 with respect to the straight line L1, are equal to each other.

The second fixing member 30 is arranged on the surface 20a of the first fixing member 20. The second fixing member 30 is displaceable relative to the first fixing member 20 at least in the planar direction of the first fixing member 20. In the fifth embodiment, the second fixing member 30 is displaceable relative to the first fixing member 20 in the planar direction of the first fixing member 20 and a direction normal to the surface 20a of the first fixing member 20. Thus, in the fifth embodiment, the second fixing member 30 is not fixed to the first fixing member 20.

The second fixing member 30 is fixed to the piezoelectric element 10A and the piezoelectric element 10B. Specifically, the second fixing member 30 is fixed to a portion of the piezoelectric element 10A, which is positioned closest to the side y1 in the perpendicular direction y, and to a portion of the piezoelectric element 10B, which is positioned closest to the side y1 in the perpendicular direction y.

The second fixing member 30 includes a connecting portion 37 and a weight portion 38. The connecting portion 37 interconnects the portion of the piezoelectric element 10A, which is positioned closest to the side y1 in the perpendicular direction y, and the portion of the piezoelectric element 10B, which is positioned closest to the side y1 in the perpendicular direction y. In the fifth embodiment, an outer-side end 10b of the piezoelectric element 10A is positioned closest to the side y1 in the perpendicular direction y, and an outer-side end 10b of the piezoelectric element 10B is positioned closest to the side y1 in the perpendicular direction y. Hence, the connecting portion 37 interconnects the outer-side end 10b of the piezoelectric element 10A and the outer-side end 10b of the piezoelectric element 10B.

The weight portion 38 is positioned between a center of the piezoelectric element 10A and a center of the piezoelectric element 10B in the tangential direction x. The weight portion 38 extends from the connecting portion 37 toward the side y2 in the perpendicular direction y.

With such an arrangement, the second fixing member 30 is restricted from displacing relative to the first fixing member 20 in the tangential direction x. On the other hand, the second fixing member 30 is displaceable relative to the first fixing member 20 in the perpendicular direction y. Thus, in the fifth embodiment, the piezoelectric element 10B provided in addition to the piezoelectric element 10A functions as a restriction member for restricting the displacement of the second fixing member 30 relative to the first fixing member 20 in the tangential direction x, like the projected portion 22 in the fourth embodiment. Accordingly, the outer-side end 10b of the piezoelectric element 10A and the outer-side end 10b of the piezoelectric element 10B are both displaceable just in the perpendicular direction y relative to the first fixing member 20 to which a center-side end 10a of the piezoelectric element 10A and a center-side end 10a of the piezoelectric element 10B are fixed. As a result, a high level of power generation efficiency can be realized as in the fourth embodiment.

According to the fifth embodiment, in particular, since two piezoelectric elements 10 are provided within one piezoelectric power generation device 1c, a higher level of power generation efficiency can be realized without enlarging the size of the piezoelectric power generation device 1c.

Further, fixing two piezoelectric elements 10 to the second fixing member 30 as in the fifth embodiment means that the second fixing member 30 is fixed at two ends. Therefore, the displacement of the second fixing member 30 relative to the first fixing member 20 in the perpendicular direction y can be stabilized.

Particularly, according to the fifth embodiment, since the resonance frequency of the piezoelectric element 10A and the resonance frequency of the piezoelectric element 10B are equal to each other, the displacement of the second fixing member 30 relative to the first fixing member 20 in the tangential direction x can be more stabilized. Hence, the displacement of the second fixing member 30 relative to the first fixing member 20 can be increased. As a result, a higher level of power generation efficiency can be realized.

Moreover, when a plurality of piezoelectric elements 10 are provided as in the fifth embodiment, the stress imposed to one piezoelectric element can be reduced. Hence, the piezoelectric element 10 can be effectively protected against damage.

Additionally, according to the fifth embodiment, since the connecting portion 37 interconnects the outer-side end 10b of the piezoelectric element 10A and the outer-side end 10b of the piezoelectric element 10B, the entirety of the piezoelectric elements 10A and 10B is deformed to a larger extent upon the second fixing member 30 displacing relative to the first fixing member 20. As a result, a higher level of power generation efficiency can be realized.

Sixth Embodiment

Figure 17:
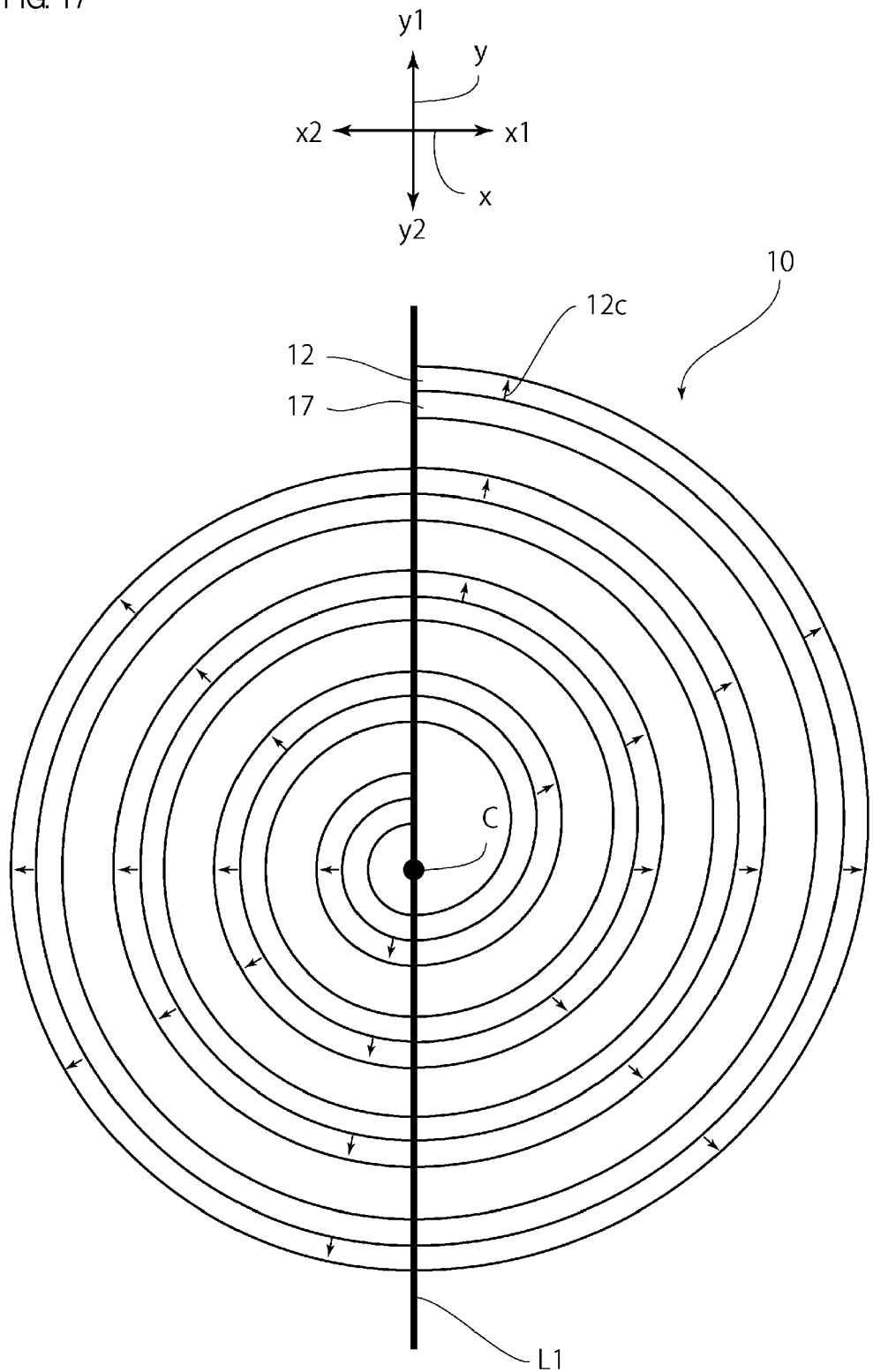
FIG. 17 is a schematic plan view to explain the direction of polarization in the piezoelectric element in a sixth embodiment (electrodes are omitted in FIG. 17 for convenience in drawing the figure)

The first embodiment has been described in connection with the case where the first and second piezoelectric bodies 11 and 12 are both provided as illustrated in FIG. 4. However, the present invention is not limited to such an arrangement. For example, one of the first and second piezoelectric bodies 11 and 12 may be formed of a non-piezoelectric elastic body other than a piezoelectric body. As illustrated in FIG. 17, by way of example, a non-piezoelectric elastic member 17 substantially in a spiral shape may be provided instead of the first piezoelectric body 11. Even with the case of using the non-piezoelectric elastic member 17, stresses imposed to the second piezoelectric body 12 are the same as those imposed to the second piezoelectric body 12 in the first embodiment. Hence, a high level of power generation efficiency can be obtained as in the first embodiment.

Similarly, at least one of the first and second piezoelectric bodies 11 and 12 in at least one of the first and second piezoelectric elements 10A and 10B in the second embodiment may be formed of a non-piezoelectric elastic body other than a piezoelectric body.

Materials usable to form the non-piezoelectric elastic member 17 are not limited to particular ones so long as the used material is other than a piezoelectric body and has elasticity. The non-piezoelectric elastic member 17 can be formed of, e.g., a metal, a resin, a ceramic, etc.

In the sixth embodiment, the first piezoelectric body 11 may be provided in multiple layers.

Seventh Embodiment

Figure 18:
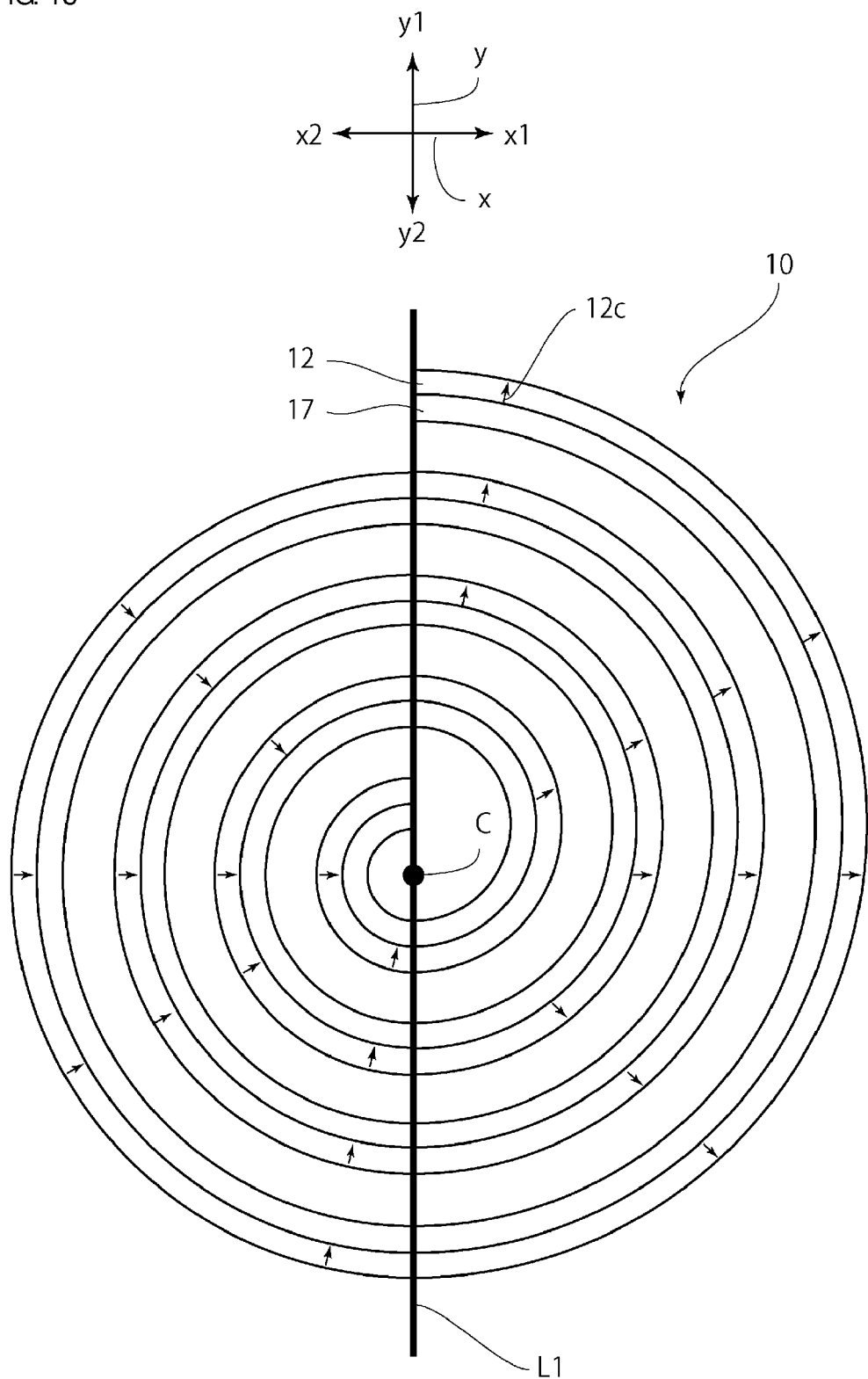
FIG. 18 is a schematic plan view to explain the direction of polarization in the piezoelectric element in a seventh embodiment (electrodes are omitted in FIG. 18 for convenience in drawing the figure)
Figure 19:
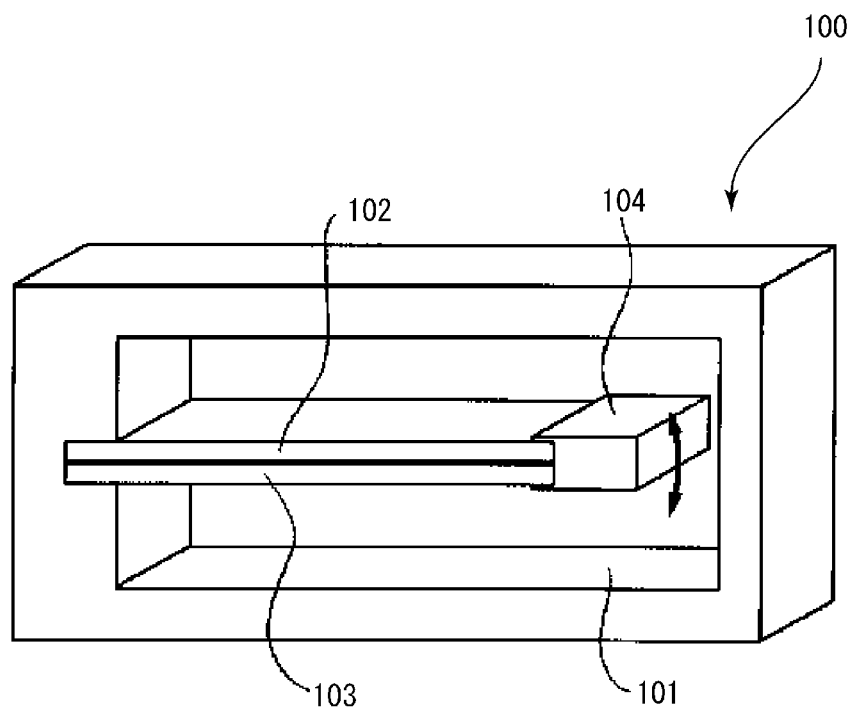
FIG. 19 is a schematic perspective view of a piezoelectric power generation device described in Japanese Patent No. 3170965.

The fourth embodiment has been described in connection with the case where the first and second piezoelectric bodies 11 and 12 are both provided. However, the present invention is not limited to such an arrangement. For example, one of the first and second piezoelectric bodies 11 and 12 may be formed of a non-piezoelectric elastic body other than a piezoelectric body. As illustrated in FIG. 18, by way of example, a non-piezoelectric elastic member 17 substantially in a spiral shape may be provided instead of the first piezoelectric body 11. Even with the case of using the non-piezoelectric elastic member 17, stresses imposed to the second piezoelectric body 12 are the same as those imposed to the second piezoelectric body 12 in the fourth embodiment. Hence, a high level of power generation efficiency can be obtained as in the fourth embodiment.

Similarly, at least one of the first and second piezoelectric bodies 11 and 12 in at least one of the first and second piezoelectric elements 10A and 10B in the fifth embodiment may be formed of a non-piezoelectric elastic body other than a piezoelectric body.

The first and second piezoelectric bodies 11 and 12 are each provided in the form of a single layer in the above-described embodiments, but the first and second piezoelectric bodies 11 and 12 may be each provided in the form of multiple layers.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A piezoelectric power generation device comprising:
a spiral-shaped piezoelectric element having a center-side end and an outer-side end;
a first fixing member to which the center-side end of the piezoelectric element is fixed; and
a second fixing member to which the outer-side end of the piezoelectric element is fixed,
the piezoelectric element including:
a first spiral-shaped piezoelectric body;
a first electrode disposed on a first surface of the first piezoelectric body;
a second electrode disposed on a second surface of the first piezoelectric body opposite the first surface; and
a spiral-shaped member disposed on one of the second electrode and the first electrode,
wherein a first portion of the first piezoelectric body, which is located on one side of a line passing a center of the piezoelectric element and the outer-side end of the piezoelectric element, is polarized in the radial direction of the piezoelectric element from one side toward the other side thereof, and a second portion of the first piezoelectric body, which is located on the other side of the line passing the center of the piezoelectric element and the outer-side end of the piezoelectric element, is polarized in a direction opposite to the first portion, and
wherein the first and second fixing members are arranged such that the second fixing member is displaceable relative to the first fixing member in a direction in which the line passing the center of the piezoelectric element and the outer-side end of the piezoelectric element extends, and the second fixing member is restricted from displacing relative to the first fixing member in a direction tangential to the outer-side end of the piezoelectric element.

2. The piezoelectric power generation device according to claim 1, wherein the spiral-shaped member is a second piezoelectric body,
a first portion of the second piezoelectric body, which is located on one side of the line passing the center of the piezoelectric element and the outer-side end of the piezoelectric element, is polarized in the radial direction of the piezoelectric element from the other side toward the one side, and a second portion of the second piezoelectric body, which is located on the other side of the line passing the center of the piezoelectric element and the outer-side end of the piezoelectric element, is polarized in the radial direction of the piezoelectric element from the one side toward the other side, and
the piezoelectric element further includes a third electrode disposed on a surface of the second piezoelectric body.

3. The piezoelectric power generation device according to claim 1, wherein the spiral-shaped member is an elastic body.

4. The piezoelectric power generation device according to claim 1, wherein the first fixing member includes a plate-like member having one surface on which the piezoelectric element is positioned, and a projected portion projecting from the one surface of the plate-like member at a position outwards of the outer-side end of the piezoelectric element in the radial direction,
the second fixing member includes a first guide portion extending in the direction in which the line passing the center of the piezoelectric element and the outer-side end of the piezoelectric element extends, and positioned on one side with respect to the projected portion in the direction tangential to the outer-side end of the piezoelectric element, and a second guide portion extending in the direction in which the line passing the center of the piezoelectric element and the outer-side end of the piezoelectric element extends, and positioned on the other side with respect to the projected portion in the direction tangential to the outer-side end of the piezoelectric element, and
the first and second guide portions are each held in contact with the projected portion.

* * * * *